United States Patent
Reynolds

(10) Patent No.: US 8,653,834 B2
(45) Date of Patent: Feb. 18, 2014

(54) INPUT DEVICE WITH FLOATING ELECTRODES HAVING AT LEAST ONE APERTURE

(75) Inventor: Joseph Kurth Reynolds, Mountain View, CA (US)

(73) Assignee: Synaptics Incorporated, San Jose, CA (US)

( * ) Notice: Subject to any disclaimer, the term of this patent is extended or adjusted under 35 U.S.C. 154(b) by 511 days.

(21) Appl. No.: 13/006,019

(22) Filed: Jan. 13, 2011

(65) Prior Publication Data

US 2011/0175671 A1  Jul. 21, 2011

Related U.S. Application Data

(60) Provisional application No. 61/295,603, filed on Jan. 15, 2010.

(51) Int. Cl.
*G01R 27/26* (2006.01)
(52) U.S. Cl.
USPC .......................................... 324/658
(58) Field of Classification Search
USPC ............... 324/658–690; 178/18.06, 19.03; 341/33; 345/173, 174
See application file for complete search history.

(56) References Cited

U.S. PATENT DOCUMENTS

| | | | | |
|---|---|---|---|---|
| 6,292,001 | B1 * | 9/2001 | Sasaki et al. | 324/662 |
| 6,452,514 | B1 * | 9/2002 | Philipp | 341/33 |
| 7,288,946 | B2 * | 10/2007 | Hargreaves et al. | 324/678 |
| 2003/0215976 | A1 | 11/2003 | Bruce et al. | |
| 2008/0006453 | A1 | 1/2008 | Hotelling | |
| 2008/0007539 | A1 | 1/2008 | Hotelling | |
| 2008/0245582 | A1 | 10/2008 | Bytheway | |
| 2008/0309634 | A1 | 12/2008 | Hotelling et al. | |
| 2009/0256821 | A1 | 10/2009 | Mamba et al. | |
| 2009/0273573 | A1 | 11/2009 | Hotelling | |
| 2010/0020032 | A1 * | 1/2010 | Mamba et al. | 345/173 |
| 2010/0265212 | A1 | 10/2010 | Sekiguchi et al. | |

FOREIGN PATENT DOCUMENTS

| | | |
|---|---|---|
| JP | 2005156291 A | 6/2005 |
| KR | 10-20090035774 A | 4/2009 |

OTHER PUBLICATIONS

International Search Report, PCT/US2011/021316, mailed on Aug. 30, 2011.

* cited by examiner

*Primary Examiner* — Melissa Koval
*Assistant Examiner* — Daniel Miller
(74) *Attorney, Agent, or Firm* — Ingrassia Fisher & Lorenz P.C.

(57) ABSTRACT

Devices and methods are provided that facilitate improved input device performance. The devices and methods utilize a transmitter sensor electrode and a receiver sensor electrode that are capacitively coupled to form a transcapacitance for capacitively sensing input objects in a sensing region. A measure of the transcapacitance may be used to determine positional information for the input objects in the sensing region. In accordance with the various embodiments, the devices and methods include a floating electrode that is ohmically insulated from other electrical elements during operation. A first portion of the floating electrode overlaps a portion of the transmitter sensor electrode and a second portion of the floating electrode overlaps a portion of the receiver sensor electrode. The floating electrode additionally includes at least one aperture within the first portion of the floating electrode, where the at least one aperture at least in part overlaps the transmitter sensor electrode.

20 Claims, 17 Drawing Sheets

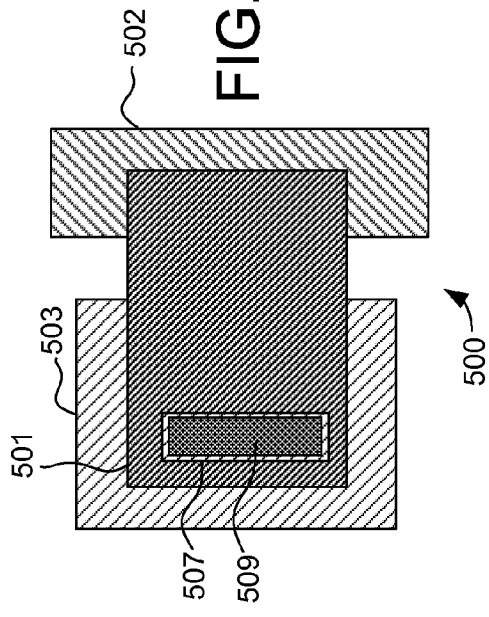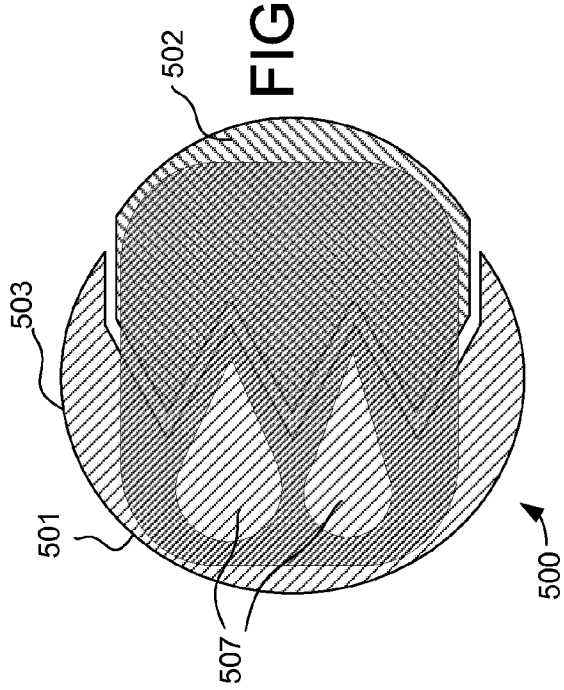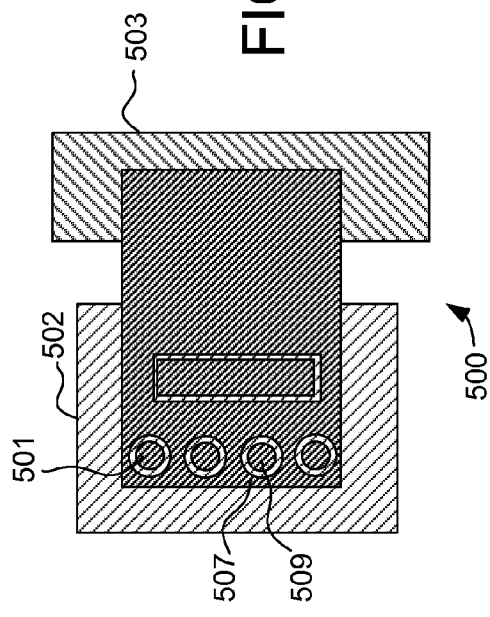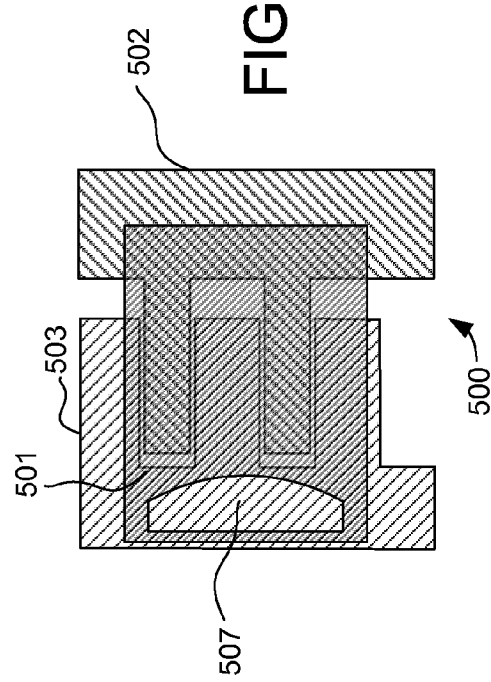

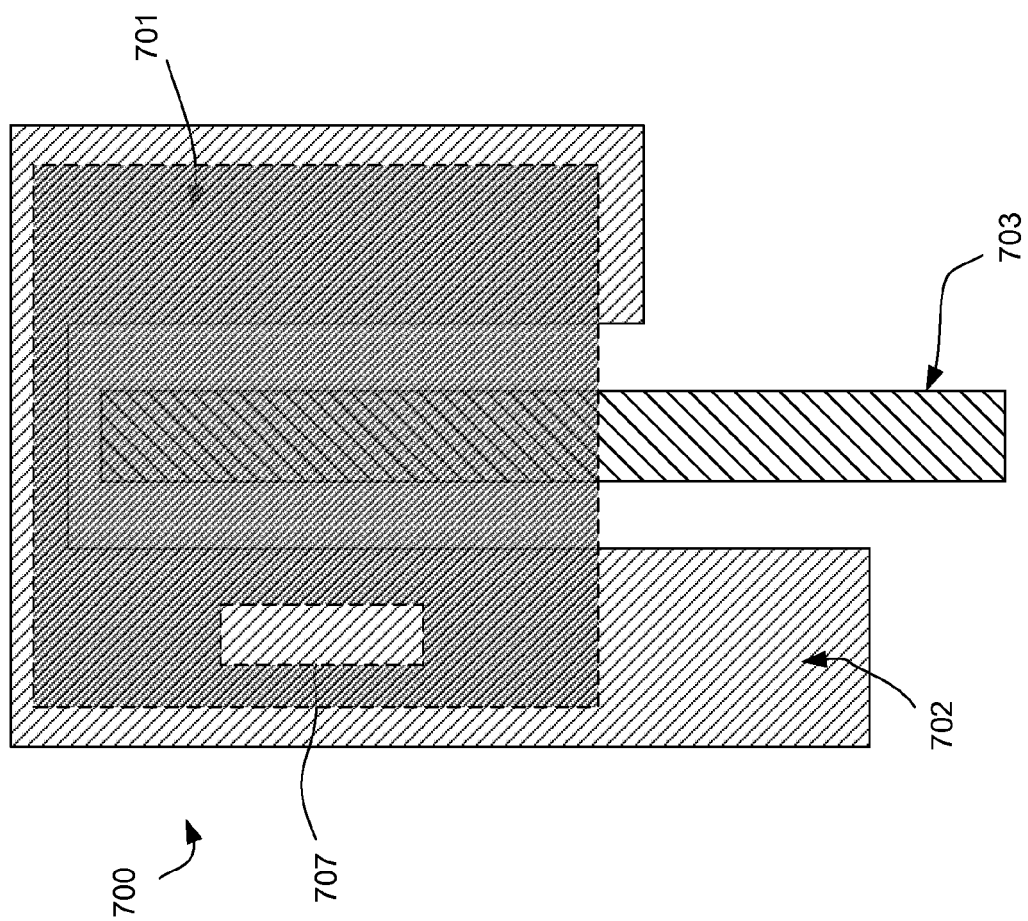

INPUT DEVICE WITH FLOATING ELECTRODES HAVING AT LEAST ONE APERTURE

PRIORITY DATA

This application claims priority of U.S. Provisional Patent Application Ser. No. 61/295,603, which was filed on Jan. 15, 2010, and is incorporated herein by reference.

FIELD OF THE INVENTION

This invention generally relates to electronic devices, and more specifically relates to input devices, such as proximity sensor devices.

BACKGROUND OF THE INVENTION

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

There is a continuing need for improvements in input devices. For example, there is a continuing need to improve the sensitivity of input devices. Improving the sensitivity of input device can improve the ability to accurately detect objects in the sensing region, and can thus improve usability of the input device as an interface to an electronic system.

BRIEF SUMMARY OF THE INVENTION

Devices and methods are provided that facilitate improved input device performance. The devices and methods utilize a transmitter sensor electrode and a receiver sensor electrode that are capacitively coupled to form a transcapacitance for capacitively sensing input objects in a sensing region. A measure of the transcapacitance may be used to determine positional information for the input objects in the sensing region.

In accordance with the various embodiments, the devices and methods include a floating electrode that is ohmically insulated from other electrical elements during operation. A first portion of the floating electrode overlaps a portion of the transmitter sensor electrode and a second portion of the floating electrode overlaps a portion of the receiver sensor electrode. The floating electrode additionally includes at least one aperture within the first portion of the floating electrode, where the at least one aperture at least in part overlaps the transmitter sensor electrode.

In general, the at least one aperture overlapping the transmitter sensor electrode serves to improve sensitivity in the input device. In particular, the at least one aperture serves to reduce capacitive coupling between the transmitter sensor electrode and the floating electrode and thereby increase signal-to-noise performance of the input device.

In some implementations, the at least one aperture facilitates an input device structure where the transmitter sensor electrode and receiver sensor electrode are formed in a same layer. Additionally, in variations on this embodiment, at least one jumper and the floating electrode are formed in a same layer, where the at least one jumper is configured to connect transmitter sensor electrodes. These embodiments may provide a high sensitivity input device with relatively low cost and complexity.

Thus, the various embodiments provide improved input device performance by improving the determination of a measure of the transcapacitance for capacitively sensing objects in a sensing region.

BRIEF DESCRIPTION OF DRAWINGS

The preferred exemplary embodiment of the present invention will hereinafter be described in conjunction with the appended drawings, where like designations denote like elements, and.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Devices and methods are provided that facilitate improved input device performance. The devices and methods utilize a transmitter sensor electrode and a receiver sensor electrode that are capacitively coupled to form a transcapacitance for capacitively sensing input objects in a sensing region. A measure of the transcapacitance may be used to determine positional information for the input objects in the sensing region.

In accordance with the various embodiments, the devices and methods include a floating electrode that is ohmically insulated from other electrical elements during operation. A first portion of the floating electrode overlaps a portion of the transmitter sensor electrode and a second portion of the floating electrode overlaps a portion of the receiver sensor electrode. The floating electrode additionally includes at least one aperture within the first portion of the floating electrode, where the at least one aperture at least in part overlaps the transmitter sensor electrode.

Figure 1:
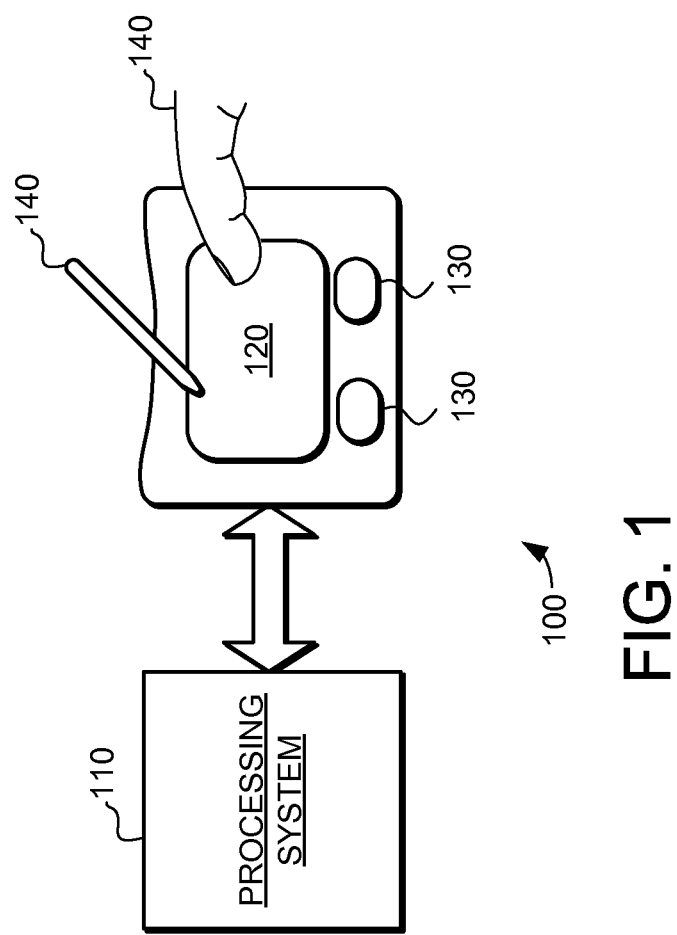
FIG. 1 is a block diagram of an exemplary system including an input device in accordance with an embodiment of the invention.

Turning now to the figures, FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and capacitive sensing technologies to detect user input in the sensing region 120. For example, the input device 100 comprises one or more sensing elements for capacitively detecting user input.

Some implementations are configured to provide capacitance responses that span one, two, or three dimensions in space. In one embodiment, the capacitance responses include capacitive images. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitting electrodes and one or more receiving electrodes. Transmitting sensor electrodes may be modulated relative to a reference voltage (e.g., system ground) to facilitate transmission, and receiving sensor electrodes may be held substantially constant relative to the reference voltage to facilitate receipt. Sensor electrodes may be dedicated transmitters or receivers, or may be configured to both transmit and receive in a time multiplexed manner. Sensor electrodes that transmit are sometimes referred to as the "transmitting sensor electrodes," "driving sensor electrodes," "transmitters," or "drivers"—at least for the duration when they are transmitting. Other names may also be used, including contractions or combinations of the earlier names (e.g. "driving electrodes" and "driver electrodes"). Sensor electrodes that receive are sometimes referred to as "receiving sensor electrodes," "receiver electrodes," or "receivers"—at least for the duration when they are receiving. Similarly, other names may also be used, including contractions or combinations of the earlier names. In one embodiment, a transmitting sensor electrode is modulated relative to a system ground to facilitate transmission. In another embodiment, a receiving sensor electrode is not modulated relative to system ground to facilitate receipt. In further embodiments, receiver sensor electrodes may be held substantially constant relative to the reference voltage to facilitate receipt of resulting signals comprising response(s) corresponding to the transmitter signal(s). Sensor electrodes may be dedicated transmitters or receivers, or may be configured to both transmit and receive.

Transcapacitance sensing may be used to sense capacitive images for parts of or entire sensing regions using an array of sensor electrodes. Such sensors employing transcapacitive sensing are often referred to as capacitive imaging touch sensors because the arrangement of sensor electrodes in an array is convenient. In one embodiment, an array may include an array of capacitive pixels. For example, some systems may scan the entire sensing region and array and produce an image of changes in capacitive coupling for an entire surface associated with the sensing region. The image may include zero-dimensional (e.g. buttons), one-dimensional (e.g. linear sliders) or two-dimensional (e.g. touchpads) information. The system may then use the image to ascertain the number of input objects and their locations.

In many embodiments of capacitance imaging touch sensors, a full scan of the array of measurements or all the "pixels" is used to create the image. Each "pixel" may be associated with a spatial location in the touch sensor where a change in capacitive coupling can be independently determined (e.g. between a transmitting and receiving sensor electrode pair). The image may be used to determine the presence or some other information (e.g. location, motion) of one or more input objects (e.g. fingers) within the sensing region. In some embodiments the image may be used to reject or limit interference of input objects (e.g. palm or cheek rejection). In one embodiment a "pixel" or "capacitive pixel" may be representative of a capacitive button. One or more sets of pixels along a path (either closed or open) may be representative of a 1-D sensor or multiple 1-D sensors. A set of pixels in a 2-D array may be representative of a 2-D sensor (e.g., multi-touch sensors).

In FIG. 1, a processing system (or "processor") 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components; in some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In accordance with some embodiments, a position acquisition module is configured to acquire a set of sensor values using at least one sensing element of the input device. Likewise, a determiner module is configured to determine an estimated deflection response associated with a deflection of the at least one sensing element using the set of sensor values, the deflection caused by a force applied by an object to the input device, wherein the estimated deflection response at least partially accounts for effects of capacitive coupling with the object. The determiner module may also be configured to determine object information from the estimated deflection response.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions. In one embodiment, a mode may include a low-power mode.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. In one embodiment, spatial resolution includes size of the input object. Exemplary "zero-dimensional" positional information includes near/far or contact/no contact information. Exemplary "one-dimensional" positional information includes positions along an axis. Exemplary "two-dimensional" positional information includes position in a plane. Exemplary "three-dimensional" positional information includes position in space and position and magnitude of a velocity in a plane. Further examples include other representations of spatial information. Historical data regarding one or more types of positional information may also be determined and/or stored, including, for example, historical data that tracks position, motion, or instantaneous velocity over time. In various embodiments, positional information for multiple inputs (e.g., more than one input) may be simultaneously and independently reported. In other embodiments, reporting may be suppressed for some or all input objects having predetermined characteristics. For example, input objects that are determined to be too large and reporting may be suppressed. In other embodiments, positional information may be used to determine when to suppress reporting.

So determined, the positional information may be used to facilitate a full range of interface inputs, including use of the proximity sensor device as a pointing device for selection, cursor control, scrolling, and other user interface functions.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. In one embodiment, buttons 130 may comprise tactile snap dome switches. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

In accordance with the various embodiments, the devices and methods include a floating electrode that is ohmically insulated from other electrical elements during operation. In one embodiment, the floating electrode is not insulated from input objects. A first portion of the floating electrode overlaps a portion of the transmitter sensor electrode and a second portion of the floating electrode overlaps a portion of the receiver sensor electrode. The floating electrode additionally includes at least one aperture within the first portion of the floating electrode, where the at least one aperture at least in part overlaps the transmitter sensor electrode.

In general, the at least one aperture overlapping the transmitter sensor electrode serves to improve sensitivity in the input device. In particular, the at least one aperture serves to reduce capacitive coupling between the transmitter sensor electrode and the floating electrode, and thereby increasing signal-to-noise performance of the input device.

Figure 2B:
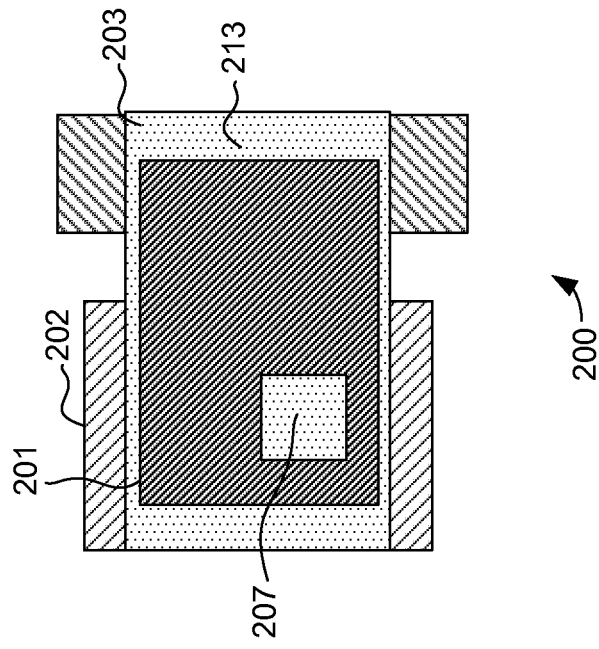
FIGS. 2-9B are schematic diagrams of parts of input devices in accordance with various embodiments of the invention.
Figure 2A:
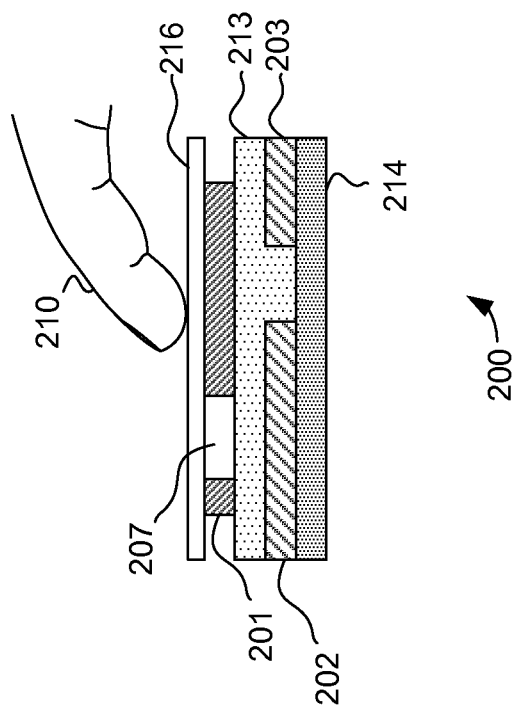

Turning now to FIGS. 2A and 2B, a side view of an exemplary input device 200 is illustrated schematically in FIG. 2A, and a partial top view of device 200 is partially illustrated in FIG. 2B. The input device 200 includes sensor electrodes comprising a transmitter sensor electrode 202 and a receiver sensor electrode 203. The input device also includes a floating electrode 201 that comprises at least one aperture 207. It should be noted that in input device 200, the floating electrode 201 overlaps at least a portion of the transmitter sensor electrode 202 and the receiver sensor electrode 203. Furthermore, the at least one aperture 207 is formed at least in part in a first portion of the floating electrode 201 that overlaps the transmitter sensor electrode 202, and thus the aperture 207 at least in part overlaps the transmitter sensor electrode 202.

In one embodiment, between the floating electrode 201 and the sensor electrodes 202 and 203 is an insulating layer 213. Likewise, in another embodiment, insulating layer 213 may also be between transmitter sensor electrode 202 and receiver sensor electrode 203. In another embodiment, the insulating layer between transmitter sensor electrode 202 and receiver sensor electrode 203 may be a separate from insulating layer 213. The insulating layer 213 ohmically isolates the floating electrode 201 from the transmitter sensor electrode 202 the receiver sensor electrode 203 and in part defines the transcapacitance between those electrodes. In some embodiments insulating layer 213 is optional and an air gap may be provided to ohmically isolate floating electrode 201 from transmitter sensor electrode 202 and receiver sensor electrode 203.

Finally, in one embodiment a protective layer 216 covers the floating electrode layer 201. In various embodiments, protective layer 216 is optional and may not be included. It should be noted that while all these elements are illustrated in FIG. 2A, for clarity FIG. 2B illustrates only the transmitter sensor electrode 202, the receiver sensor electrode 203, the floating electrode 201 and insulating layer 213.

The transmitter sensor electrode 202 and the receiver sensor electrode 203 are capacitively coupled together through floating electrode 201 for sensing inputs objects (e.g., finger 210) in the sensing region. Specifically, the transmitter sensor electrode 202 and the receiver sensor electrode 203 are capacitively coupled through the floating electrode 201 to form a transcapacitance. When input objects such as finger 210 are brought proximate to the input device 200 (i.e., within the sensing region of input device 200) they can couple to the floating electrode, causing a change in the measured transcapacitance between the transmitter sensor electrode and the receiver sensor electrode. This change in transcapacitance may be measured and used to detect the presence of the objects causing the change, and determine positional information related to these objects.

As one example, because a human finger (e.g., finger 210) is conductive, it can capacitively couple to the floating electrode, and because the finger is coupled sufficiently to ground (e.g. it is coupled to the human, which has significant self capacitance and capacitively or resistively coupled to device ground), when the finger 210 approaches and contacts the sensor, it couples the floating electrode 201 to ground. In many embodiments, the input object coupling to device (or system) ground is sufficiently large allowing it to be treated as ground. As a result, the floating electrode 201 intercepts the electric field between the transmitting and receiving sensor electrodes, thus decreasing the transcapacitance measured between them. Thus, the finger 210 will generally appear as a reduction in transcapacitance, meaning a reduction in capacitive coupling between transmitting and receiving sensor electrodes in the region of the finger. This reduction in transcapacitance may be sensed and measured by the processing system and used to determine position information for the finger 210. Furthermore, and as will be described in greater detail below, the inclusion of the aperture 207 will cause an increase in the reduction in capacitive coupling that will occur as a result of the finger 210 relative to the total coupling capacitance of floating electrode 201. The increase in the reduction of capacitive coupling that occurs in response to objects such as finger 210 serves to improve sensitivity in the input device 200, and in particular, increase signal-to-noise performance of the input device 200.

It should be noted that while a finger 210 is used in this example, other conductive objects with sufficient capacitive coupling to the floating electrode may also cause decreases in the measured transcapacitance. For example, a variety of styli and other such objects may be used in typical implementations. In many cases, the input objects may include AC-grounded input objects, digits (e.g., finger 210), styli or pens. In one embodiment, their voltage is stationary relative to the frequency of the transmitter signal.

A variety of different materials and techniques may be used to form the transmitter sensor electrode 202, the receiver sensor electrode 203, and the floating electrode 201. For example, the transmitter sensor electrode 202 and the receiver sensor electrode 203 can be formed by patterning a conductive material, such as ITO (indium tin oxide), silver or carbon conductive ink, copper, aluminum and carbon nano-tubes. Further, any appropriate patterning process may be used, including sputtering, printing, molding, stamping and etching. Such materials and processes may also be used to form the floating electrode 201. It should also be noted that the same process used to define floating electrode 201 can be used to form the aperture 207 or jumpers. Alternatively, the aperture 207 may be formed in a process distinct from that used to define the floating electrode 201. In other embodiments, the insulator layer may also be pattered. In one embodiment, the insulator layer is pattered similar to floating electrode 201.

In one embodiment, the protective layer 216 is disposed over the floating electrode 206. In one embodiment, an appliqué is employed as the protective layer 216. In one embodiment, the protective layer 216 comprises a touch surface and forms a part of the capacitive touch sensor that is designed to be touched by users. When used as such a touch surface, the protective layer 216 preferably has a pleasing tactile feel or texture. Since such a touch surface is viewable to the users, it also preferably has a pleasing visual texture. The protective layer 216 can be formed from any appropriate material. For example, the protective layer 216 can be implemented using a sheet of textured polyester material. Where polyester is used, the protective layer 216 can be of any appropriate thickness, including from about 0.1 mm to about 0.6 mm thick. In many embodiments, the protective layer includes an adhesive on its underside for affixing it to the top of the floating electrode 201 or a substrate holding the floating electrode 201. In yet other embodiments, the protective layer 214 is the substrate holding the floating electrode.

The material used to form the protective layer 216 can range from completely opaque to completely transparent. A surface of the protective layer 216 may be painted or otherwise colored to give a uniform appearance. Alternatively or in addition, logos, lettering, graphics, combinations thereof, or other patterns can be applied to protective layer 216. Often, such decorations are embedded or applied on a back side of the protective layer such that they are protected from wear during use. Other materials suitable for the protective layer 216 include all manners of plastics, including polyethylene terephthalate (PET), polyimide, and polycarbonate (sometimes sold under the trade name LEXAN), combinations thereof, and the like. In an embodiment employing polycarbonate, the sheet thickness of the protective layer is often in a range of about 0.1 mm to about 4 mm.

The embodiment illustrated in FIGS. 2A and 2B is an input device 200 that includes only one transmitter sensor electrode 202, one receiver sensor electrode 203, and one floating electrode 201. Implemented by itself, such a device can be used to determine zero-dimensional positional information for one object at a time. Other implementations may include multiple such electrodes arranged together and having the ability to determine such information for multiple input objects simultaneously. Additionally, such devices can typically determine a wider range of positional information, such as the one and two dimensional position information described above. A variety of these different embodiments will be described below. It should be noted that in many of these embodiments the floating electrode could be implemented as a single electrode that overlaps multiple transmitter and receiver sensor electrodes. Conversely, such devices can be implemented with multiple floating electrodes, with one or more floating electrodes covering a portion of both sensor electrodes. Furthermore, in either case the floating electrodes may include multiple distinct apertures. In some embodiments, protective layer 216 may not be included and an input object may ohmically couple to the floating electrode or the multiple floating electrodes. However, in such embodiments, multiple responses from the input object ohmically coupling with multiple floating electrodes may still be reported.

In the embodiment illustrated in FIG. 2A, the transmitter sensor electrode 202 and the receiver sensor electrode 203 are disposed on the same surface of substrate 214. In another embodiment, sensor electrodes 202 and 203 are disposed on opposite surfaces of substrate 214. In further embodiments, sensor electrodes 202 and 203 may be disposed on surfaces of separate substrates.

In some embodiments, the transmitting and receiving sensor electrodes 202 and 203 are disposed onto a substrate assembly (e.g., substrate 214). The substrate assembly can comprise one or more substrates, such as glass or plastic substrate (one common plastic substrate is polyethylene terephthalate, PET). Substrates of other types of materials are also possible. In addition to substrates, the substrate assembly may also include other layers, including layers of conductive material or non-conductive material. These other layers may provide electrical shielding, physical protection, fastening ability, and the like. In this application, the general term substrate may be used to refer to any type of such a substrate or substrate assembly.

In general, the floating electrode 201 is configured to affect the transcapacitive coupling between sensor electrode 202 (e.g., a transmitter sensor electrode) and sensor electrode 203 (e.g., a receiver sensor electrode) when an input object is proximate to the input device 100. As was described above, the floating electrode 201 intercepts the electric field lines between the transmitting and receiving sensor electrodes, thus decreasing the transcapacitance measured between them. The floating electrode 201 coupling to sensor electrode 202 additionally provides the benefit of reducing any finger coupled interference to the receiver sensor electrode 203 by the same proportion as the change in finger coupled signal, and thus can produce higher signal to noise ratio than typical fringing field designs which allow for a coupling direct to the receiver sensor electrode. Further, back coupled interference can be reduced by sizing the transmitter and receiver sensor electrodes so that they are substantially space filling. In other embodiments, shield electrodes may be disposed proximate to the transmitter and receiver sensor electrodes to reduce back coupled interference. Additionally, the floating electrode 201 and the ratio of its capacitances to the capacitances of the transmitter and receiver sensor electrodes can be used to design the dynamic range of receiver sensor electrode 203. Finally, because the, floating electrode 201 intercepts the direct electric field between the transmitting and receiving sensor electrodes and decreases the transcapacitance measured between them, the input device may be made thinner, in the range of 1 micron to 100 microns, while maintaining significant noise immunity. In some instances, direct capacitive coupling between the transmitter and receiver sensor electrodes may be ignored. In instances where an input object substantially couples the floating electrode to ground the direct capacitive coupling between the transmitter sensor electrode and receiver sensor electrode is further reduced.

The floating electrode 201 is "electrically floating" during operation. By "electrically floating", it is meant that there is no ohmic coupling (or minimal compared to the impedance of the capacitances at the frequency of operation) between the floating electrode 201 and other circuit elements of the input device, so that no meaningful amount of charge can flow onto or off of the floating electrode 201 during operation (or at least when the input object is not present in sensing region 120). Thus, the floating electrode 201 is capacitively coupled and not ohmically coupled to other circuit elements nearby, and it would not typically require any wiring or other forms of electrical connection to other circuit elements. This can reduce the number of electrical contacts, and allow each floating electrode to be substantially isolated from each other. In one embodiment, while the floating electrodes are not ohmically coupled to other circuit elements, the floating electrodes may ohmically couple to an input object when the input object directly contacts the floating electrode.

In operation, as the finger approaches input device 100, the finger will typically capacitively couple to floating electrode 201, effectively coupling floating electrode 201 to ground through the finger. In one embodiment protective layer 216 may control the maximum coupling from the floating electrode to ground through the input object. The transcapacitive coupling between transmitter sensor electrode 202 and receiver sensor electrode 203 through floating electrode 201 will be reduced. As the capacitive coupling between the finger and floating electrode 201 increases, the transcapacitive coupling will further decrease. In one embodiment, the transcapacitive coupling can be measured by a processing system and any change (for example a decrease) can be used to determine positional information for input objects.

Floating electrode 201 can be formed to cover the entire area of transcapacitive coupling or to cover a portion of area of transcapacitive coupling. In many embodiments each floating electrode 201 and transmitter sensor electrode 202 has a similar outline shape. However, in other embodiments the floating electrodes 201 may be made larger or smaller than the transmitter sensor electrodes. In further embodiments, the floating electrodes can be shaped to create a coupling between the sensor electrodes and ground. In one embodiment, multiple floating electrodes can be capacitively coupled to the same transmitter and receiver sensor electrodes. In many combinations the floating electrodes may be comprise apertures or may they may be interdigitated with neighboring floating electrodes.

In accordance with the preferred embodiments, a first portion of the floating electrode 201 overlaps a portion of the transmitter sensor electrode 202 and a second portion of the floating electrode 201 overlaps a portion of the receiver sensor electrode 203, and the first portion includes at least one aperture 207, where the at least one aperture 207 at least in part overlaps the transmitter sensor electrode 202. The at least one aperture 207 in the floating electrode 201 overlapping the transmitter sensor electrode 202 serves to reduce capacitive coupling between the transmitter sensor electrode and the floating electrodes and thereby increase signal-to-noise performance of the input device.

The addition of at least one aperture 207 overlapping the transmitter sensor electrode 202 serves to improve sensitivity in the input device. By providing the at least one aperture 207 in the floating electrode 201, and by selecting the size, location and number of apertures, the response to an approaching finger can improved. Specifically, apertures such as aperture 207 allow an approaching input object to capacitively couple to both floating electrode 201 and the transmitter sensor electrode 202. By changing the capacitive coupling between the approaching finger and the transmitter sensor electrode 202 the response of input device 100 may be improved. Further, in one embodiment, the amount the floating electrode overlaps the transmitter sensor electrode is larger than the amount the floating electrode overlaps the receiver sensor electrode.

In various embodiments, as finger 210 approaches the floating electrode 201, the transcapactive coupling is reduced by a greater degree due to the presence of aperture 207 and the resulting capacitance coupling between finger 210 and floating electrode 201. Stated another way, the presence of the aperture 207 overlapping the transmitter sensor electrode 202 reduces a capacitance coupling between the floating electrode and transmitter sensor electrode 202, and allows the proximity of an input object to further reduce capacitive coupling between the floating electrode and transmitter sensor electrode 202, which ultimately increases the reduction in the sensed transcapacitive that occurs in response to an input object being present. This further reduction of transcapacitance caused by aperture 207 increases the sensitivity of the capacitance detection. Thus by providing one or apertures overlapping the sensor electrode, the capacitive response to an input object is improved.

The apertures included in the floating electrodes can have a variety of shapes, sizes, positions, structures and arrangements. In general an aperture can comprise any opening, gap, slot, channel, perforation, passage or hole in the floating electrode. In some embodiments each floating electrode includes one aperture. In other embodiments, each floating electrode may contain multiple apertures. In these embodiments the apertures may be laid out in a two dimensional array. Apertures may be provided as slots or holes that extend to the edge the floating electrode, or may be completely contained within the floating electrode. Further, in other embodiments, the position of each aperture may be varied.

Figure 3:
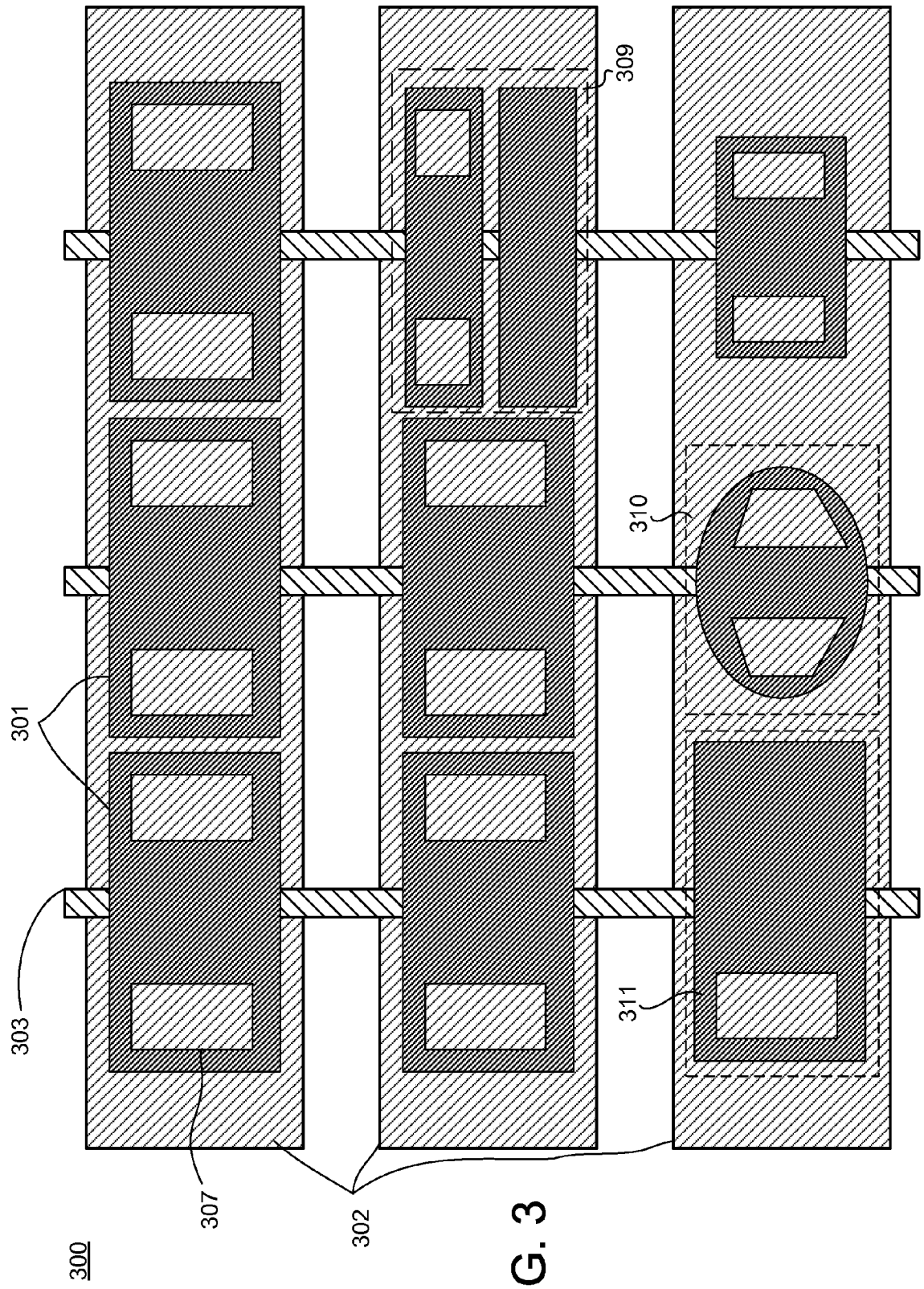

Turning now to FIG. 3, FIG. 3 illustrates a sensing device 300 comprising a two dimensional array of transmitter sensor electrodes 302, receiver sensor electrodes 303 and floating electrodes 301. Further, as illustrated a floating electrode overlaps a portion of a receiver sensor electrode and a portion of a transmitter sensor electrode. In one embodiment, the region of overlap between floating electrode, a receiver sensor electrode and transmitter sensor electrode defines a "capacitive pixel" of the two dimensional array. Section 309 of FIG. 3 illustrates a further embodiment where two floating electrodes overlap the same transmitter and receiver sensor electrodes. Even though the floating electrodes are shown as being substantially similar in size, the floating electrodes may differ in size. In one embodiment, one of or both of the floating electrodes may comprise apertures. In another embodiment, neither of the floating electrodes comprises apertures. Section 310 illustrates an embodiment where a floating electrode having an elliptical shape. In other embodiments, other shapes may be possible and the shapes of the floating electrodes may all be similar or different. In one embodiment, the floating electrode may be patterned to define the shape of the corresponding "capacitive pixel". Further, section 311 illustrates a floating electrode comprising only a single aperture. In other embodiments, any number of apertures may be used as will be discussed later in relation to FIG. 5A through FIG. 5L.

Figure 4:
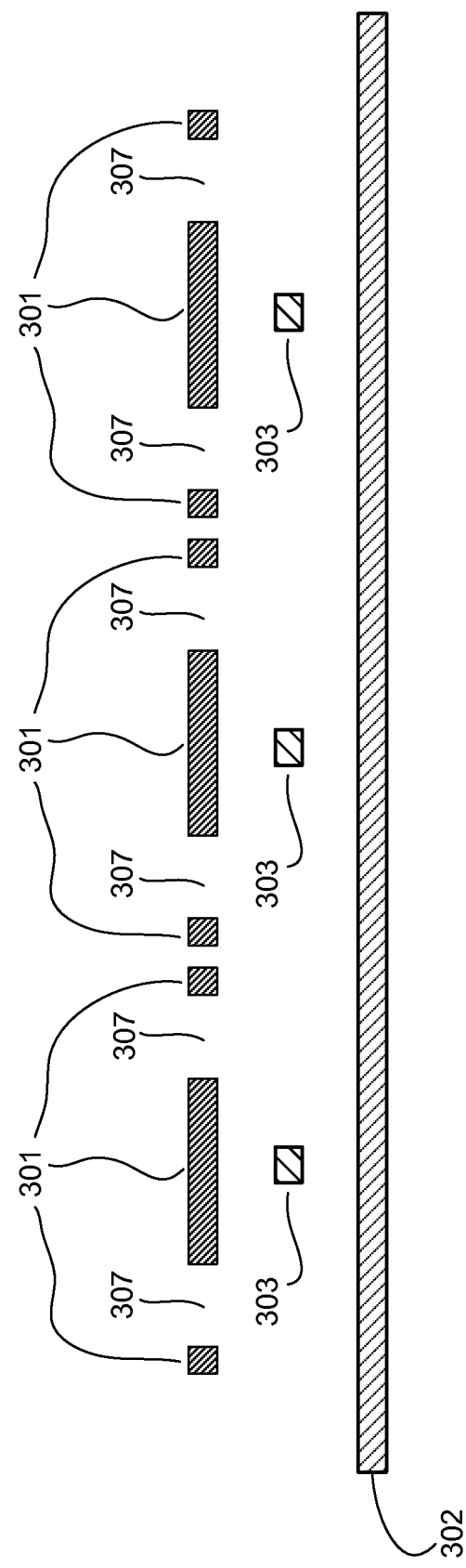

FIG. 4 illustrates a side view of a transmitter sensor electrode 302, receiver sensor electrode 302 and floating electrode 301. Floating electrode comprises apertures 307. In one embodiment, an insulating layer is disposed between floating electrode 301 and receiver sensor electrode 303 and between receiving sensor electrode 303 and transmitting sensor electrode 302.

Turning now to FIG. 5, FIG. 5 illustrates a sensing device 500 that includes a transmitter sensor electrode 502, a receiver sensor electrode 503, and floating electrode 501. The various embodiments illustrated in FIG. 5 show different types and arrangements of apertures in the floating electrode 501.

Figure 5A:
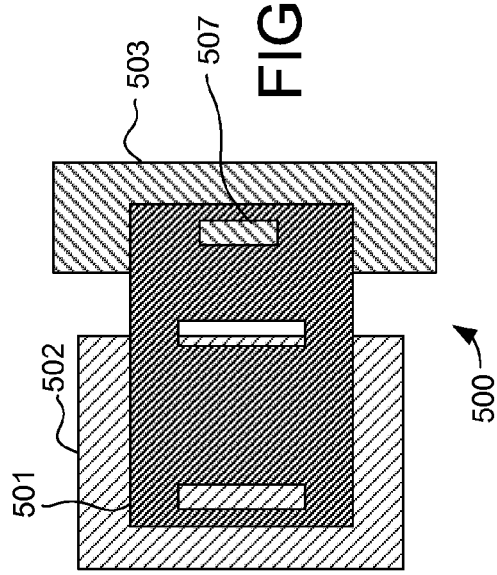

Turning specifically to FIG. 5A, in this embodiment the floating electrode 501 includes a single aperture 507. The aperture 507 in this embodiment is rectangular, although this is just one example shape. It should be noted that the aperture 507 overlaps only the area of transmitter sensor electrode 502. That is, no portion of the aperture 507 overlaps the receiver sensor electrode 503 or the area between the electrodes. It should also be noted that the aperture 507 is entirely contained with a perimeter of floating electrode 501.

Figure 5B:
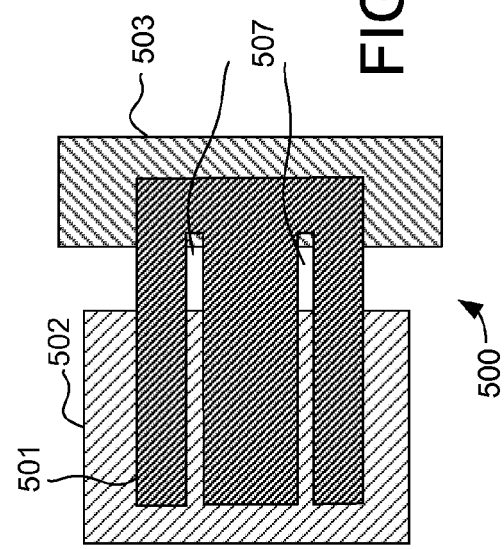

Turning specifically to FIG. 5B, in this embodiment the floating electrode 501 includes three apertures 507. The apertures 507 in this embodiment are each rectangular, although again this is just one example shape. In this example one aperture 507 overlaps only the transmitter sensor electrode 502, one aperture 507 overlaps the transmitter sensor electrode 502 and the space between electrodes, and one aperture 507 overlaps only the receiver sensor electrode 503. And again, it should also be noted that each of the apertures 507 are entirely contained with a perimeter of floating electrode 501. It should be also noted that in this embodiment, the apertures 507 formed over transmitter sensor electrodes are larger than those over receiving sensor electrodes. Such an arrangement may used to achieve the desired capacitive effects.

Figure 5C:
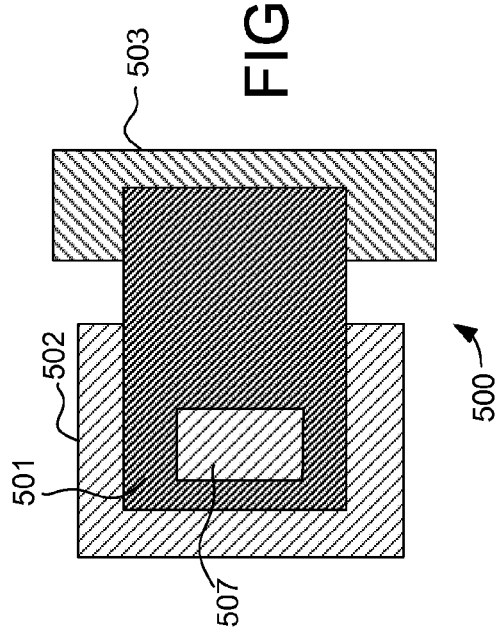
Figure 5D:
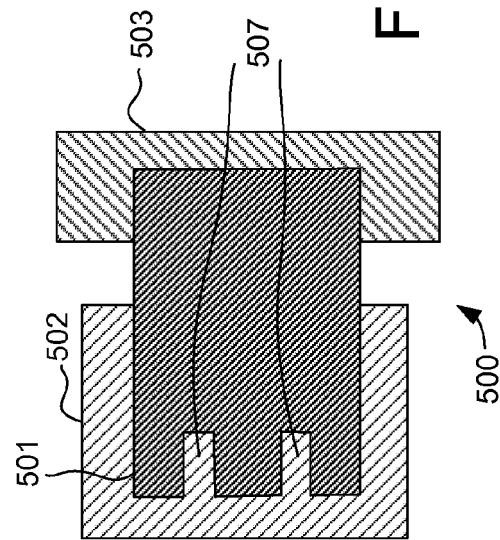

Turning specifically to FIG. 5C, in this embodiment the floating electrode 501 includes two apertures 507. In contrast with the apertures of FIGS. 5A and 5B, these apertures 507 are not entirely contained within the perimeter of the floating electrode 501. Instead, these apertures 507 are formed as a channel or slot extended into the floating electrode 501. Again, these apertures 507 overlap only the area of transmitter sensor electrode 502. That is, no portion of the aperture 507 overlaps the receiver sensor electrode 503 or the area between the electrodes. Turning specifically to FIG. 5D, in this embodiment the floating electrode 501 includes two apertures 507 similar to those in 5C, but where the area of the aperture extends across the space between electrodes and partially overlaps the receiver sensor electrode 503. Again, the apertures 507 in this embodiment are rectangular, although this is just one example shape.

Figure 5E:
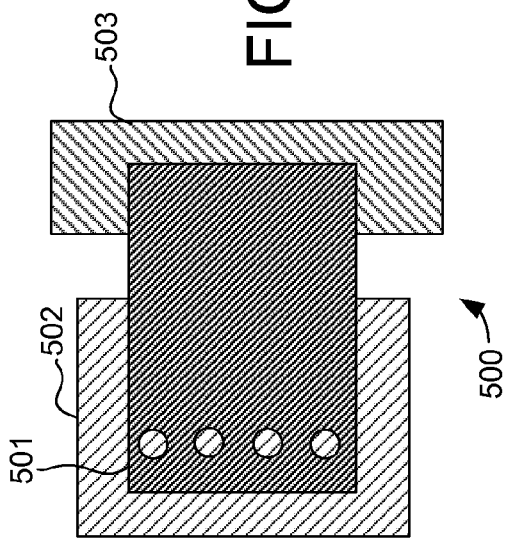
Figure 5F:
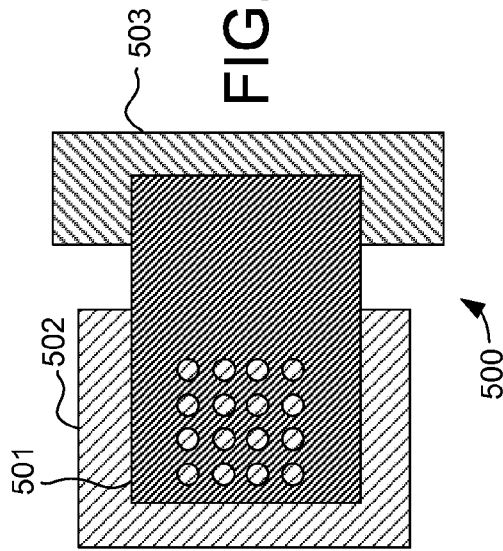
Figure 5G:
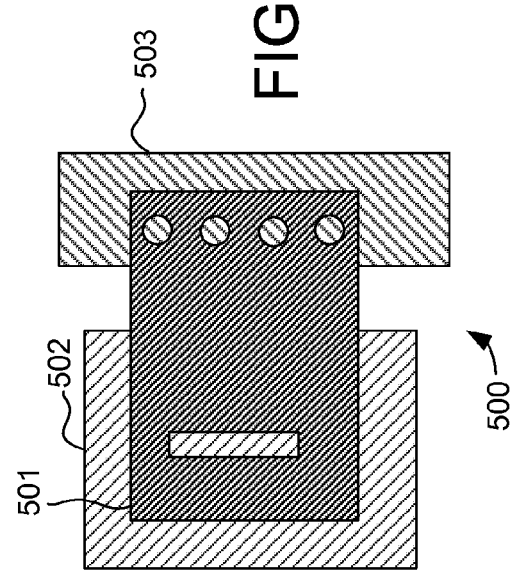
Figure 5H:
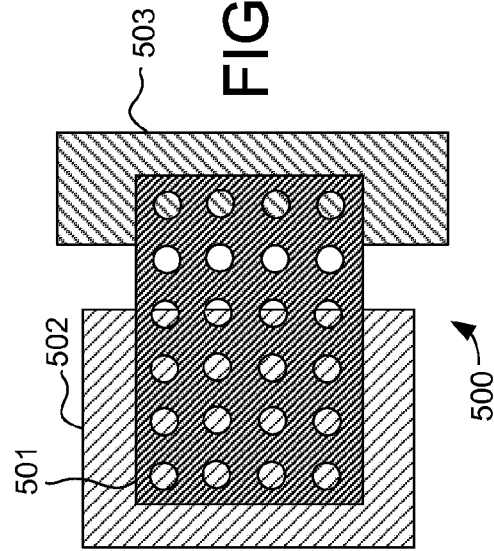

In some embodiments, each floating electrode could comprise an array of apertures. Turning specifically to FIG. 5E-5H, in these embodiments the floating electrode 501 has an array of apertures. In FIG. 5E, one dimensional array of four circular apertures are provided in floating electrode 501. In FIG. 5F, a two dimensional array of 16 apertures is provided in floating electrode 501. In FIG. 5G, a one dimensional array of four apertures overlapping the receiver sensor electrode 503 is provided, along with a larger single electrode overlapping the transmitter sensor electrode. In FIG. 5H, a two dimensional array of 24 apertures is provided that substantially fills the entire floating electrode 501. Again, these are all just examples of the type and numbers of apertures that may be provided in a floating electrode.

In some embodiments it is desirable to add one or more filling structures within the aperture. For example, in touch screen applications it is generally desirable to provide an optically uniform sensor structure. This allows images from a display underlying the sensor device to be clearly viewed by the user without excessive distortions. As was described above, in such touch screen applications the various conductive elements (sensor electrodes, floating electrodes, interconnects, etc.) are typically formed from substantially transparent materials such as ITO. Although these materials are substantially transparent, they do cause some changes in the image that may be perceptible by a user. Thus, in some applications the areas of aperture may be visible to a user when compared to neighboring areas of the floating electrode, or may otherwise create distortions in the viewed image.

To minimize these effects the apertures may be substantially filled with materials that provide improved optics. Specifically, by filling the apertures with materials having the same optical characteristics as the materials used in the floating electrode itself, the optical variation between aperture and floating electrode is minimized and the image quality is improved. These filling structures can include both conductive and non-conductive materials. Where conductive materials are used (e.g., ITO) it is preferable to keep the filling structure ohmically isolated from the floating electrode. That is, to provide a gap between the filing structure and the floating electrode. In various embodiments, the gap may be several times the thickness of the insulating layer separating the floating electrode from the transmitter and receiver electrodes. Otherwise, the filling structure would effectively become part of the floating electrode effectively eliminate the capacitive effects of the aperture. When using nonconductive materials this is generally not a concern. In general, it is desirable to size the filling structure to substantially fill the aperture such that the gaps between aperture and filling structure are relatively small. When such gaps are small enough they become essentially invisible to a typical user. Furthermore, when the filling structure is non-conductive, the filling structure may completely fill the aperture.

Turning now to FIG. 5I, the floating electrode 501 is illustrated with five apertures 507, including four circular apertures and one rectangular aperture. Each of these apertures 507 includes a filling structure 509 within. In this case, there is a relatively small gap between the floating electrode 501 and the filling structures 509, and this design would be preferable in applications that use a transparent conductive material in the filling structures 509. FIG. 5J illustrates floating electrode 501 having aperture 507 including filling structure 509. In this case the filling structure 509 and floating electrode 501 comprise different materials. FIG. 5K illustrates a transmitter sensor electrode 202 that is interdigitated with a receiver sensor electrode 502. Further, floating electrode 501 overlaps both the transmitter and receiver sensor electrode and comprises aperture 507. FIG. 5L illustrates a transmitter sensor electrode 502 interdigitated with a receiver sensor electrode 503, where the transmitter and receiver sensor electrodes are disposed with an arcuate shape. Further, floating electrode 501 overlaps the transmitter and receiver sensor electrodes, and comprises two apertures 507. Again, the shapes and configurations of these filling structures are merely exemplary.

Figure 5M:
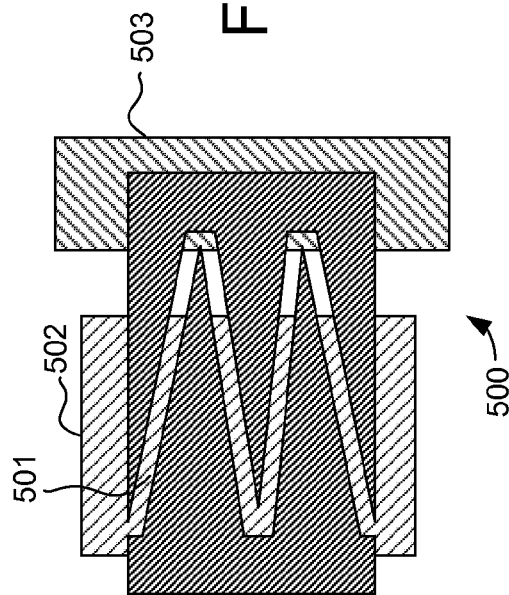
Figure 5N:
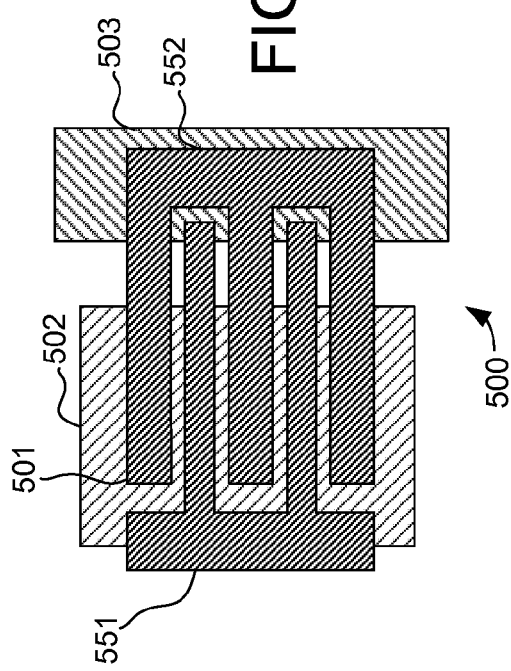

In some embodiments, it will be desirable to configure the floating electrode with interdigitated shapes and structures. Turning now to FIG. 5M, the floating electrode 501 is illustrated as comprising two portions 551 and 552. The two portions 551 and 552 of the floating electrode 501 are interdigitated together, defining an aperture between them. In the example of FIG. 5M, the interdigitated portions are substantially rectangular. However, this is just one example. Turning to FIG. 5N, in this example the two interdigitated portions of floating electrode 502 are non-rectangular.

Figure 5O:
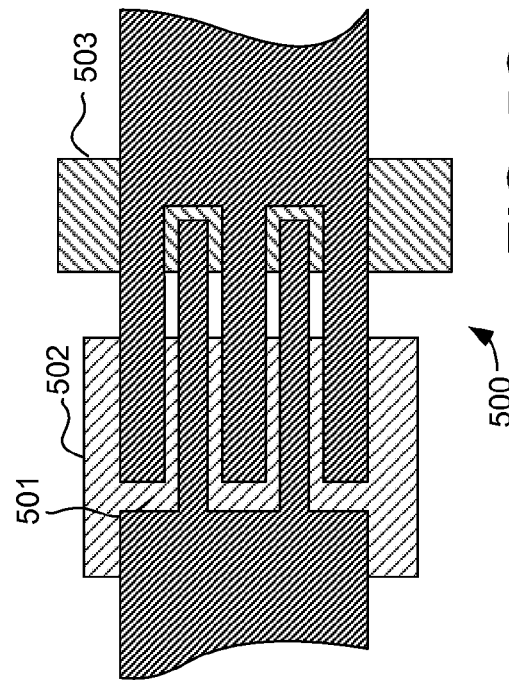

It should be noted that these two interdigitated portions may extend beyond to overlap other electrodes. Turning to FIG. 5O, the floating electrode 501 is shown extending beyond the transmitter sensor electrode 503 and the receiver electrode 502. As such, they could overlap other electrodes, including other transmitter and receiver electrodes. Additionally, such floating electrodes could be interdigitated in those regions overlapping the other transmitter and receiver electrodes, and thus comprise a continuing pattern of interdigitated floating electrodes.

Figure 6:
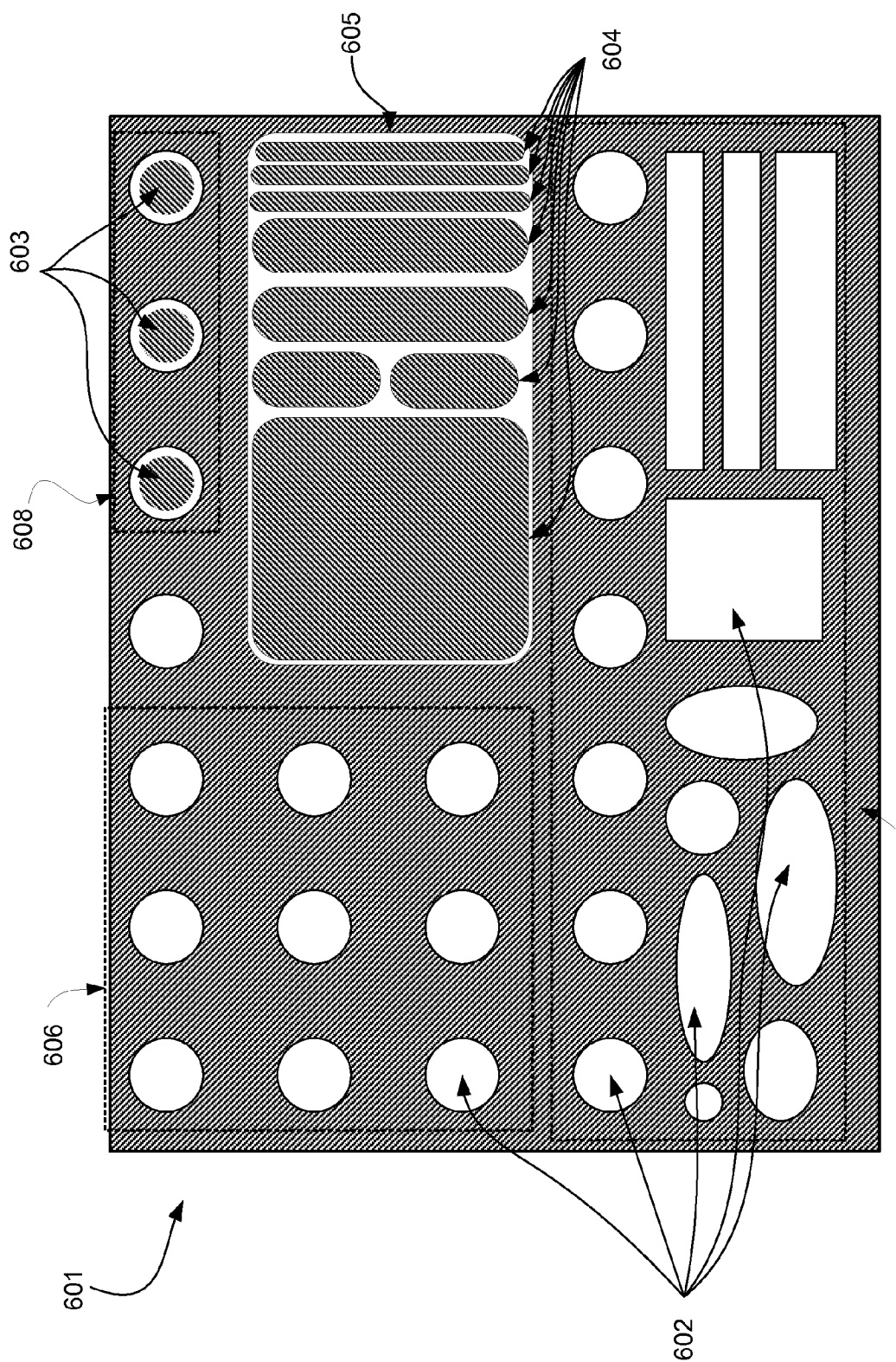

Turning now to FIG. 6, other examples and variations in apertures are illustrated on a floating electrode 601. For example, floating electrode 601 includes an aperture set 607 that includes a variety of apertures varied by size, shape and location. Further, an aperture set 608 illustrates a set of apertures having filling structures 603 within the apertures. Aperture set 606 illustrates a set of apertures of equal size, being equally spaced apart. Aperture 605 illustrates an aperture that has non-uniform filled in areas 604. As can be seen by aperture 605, the filled in areas may be varied by one or more of a size, shape or position. Again, the size, shape and position of the apertures can be used to control the response of an input device to an approaching finger. In one embodiment apertures 602 may be non-uniformly dispersed throughout floating electrode 601 having differing shapes and sizes. In another embodiment, apertures 602 may be concentrated to one side of floating electrode 601.

Furthermore, as will be described in greater detail below, the aperture may also be used to configure the floating electrode around other elements that may be disposed on the same layer as the floating electrodes, such as jumpers or shield electrodes. As will be shown below, such an arrangement may reduce the total number of layers needed by having a layer that is shared between jumpers and floating electrodes.

While the various apertures have been shown overlapping transmitter and receiver sensor electrodes, it should also be noted that they may be designed to overlap other elements. For example, the one or more apertures in a floating electrode may be configured to overlap shield electrodes that may be formed between transmitter and receiver electrodes. These shield electrodes may be held at a constant voltage (e.g., ground) or driven with a signal to act as a guard electrode. Various examples of these shield electrodes will be discussed below.

Input devices utilizing floating electrodes with at least one aperture can be implemented in a variety of different configurations. As was noted above, in some embodiments, the sensor electrodes can be configured to function as a discrete capacitive button, responding to the presence of an input object such as a user's finger. In another embodiment, multiple sensor electrodes can be configured to function as multiple buttons. The multiple buttons can be laid out in a variety of ways including various two-dimensional arrays. In a further embodiment an array of sensor electrodes can be configured to be used as a linear scroll strip to determine one-dimensional positional information. In one embodiment, a pair of one-dimensional strips may be used to determine independent two-dimensional information for an input object.

Some of these various embodiments include one or more shield electrodes. These shield electrodes may be disposed between electrodes, such as between transmitter and receiver sensor electrodes. When so implemented, the floating electrode may be configured to overlap the shield electrodes. Additionally, one or more apertures may be configured to overlap the shield electrodes.

Figure 7B:
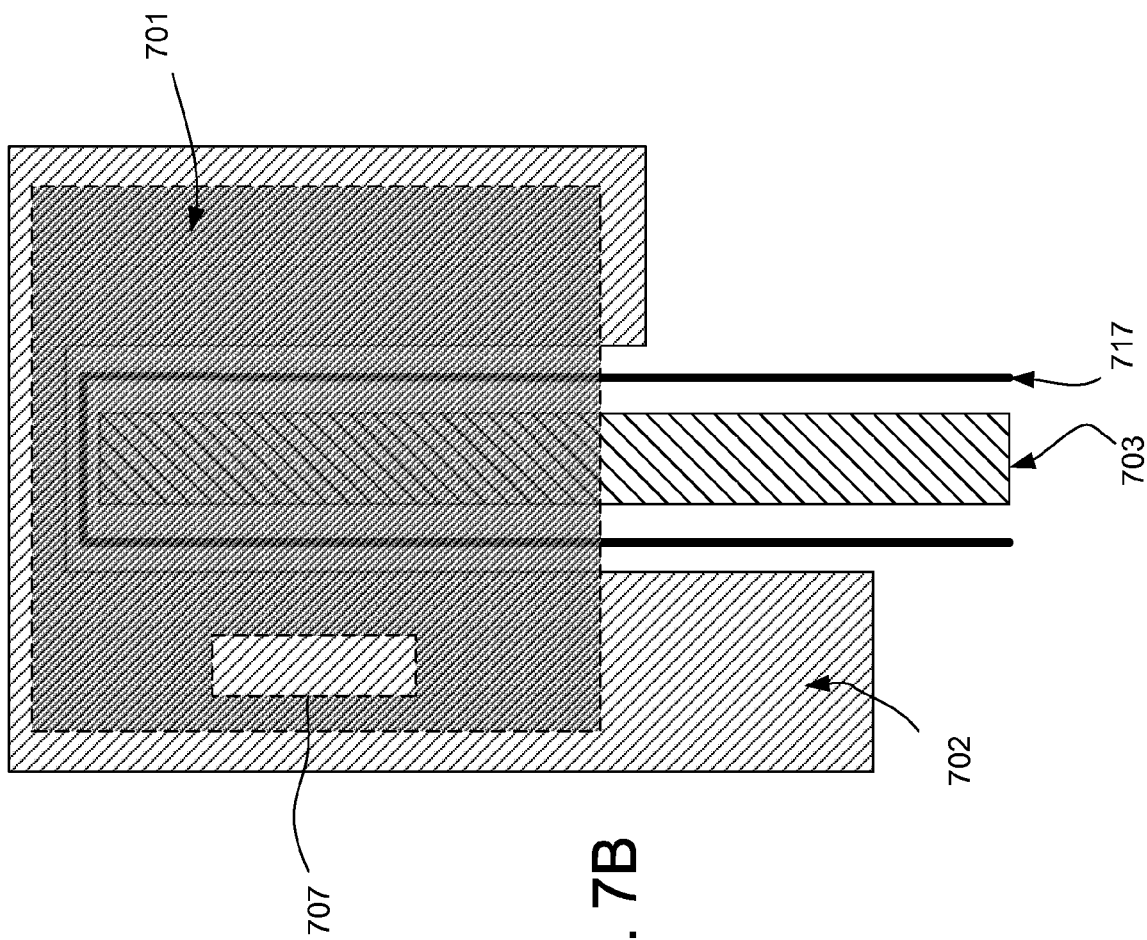

Turning now to FIG. 7A, a capacitive button comprising sensor electrodes 702 and 703 and floating electrode 701 is illustrated. In one embodiment sensor electrode 702 is configured to perform as a transmitter and sensor electrode 703 is configured to perform as a receiver. In the illustrated embodiment, floating electrode 701 comprises at least one aperture 707. The at least one aperture 707 is positioned to overlap a portion of the transmitter sensor electrode 702. FIG. 7B illustrates a similar capacitive button further comprising shield electrode 717 disposed between transmitter sensor electrode 702 and receiver sensor electrode 703. Shield electrode 717 reduces the direct capacitive coupling between transmitter sensor electrode 702 and receiver sensor electrode 703. In various embodiments, shield electrode 717 may also be a ground electrode. In one embodiment a shield (or ground) layer may be used instead of or in conjunction with shield electrode 717 to reduce the capacitive coupling between transmitter and receiver sensor electrodes.

Figure 7C:
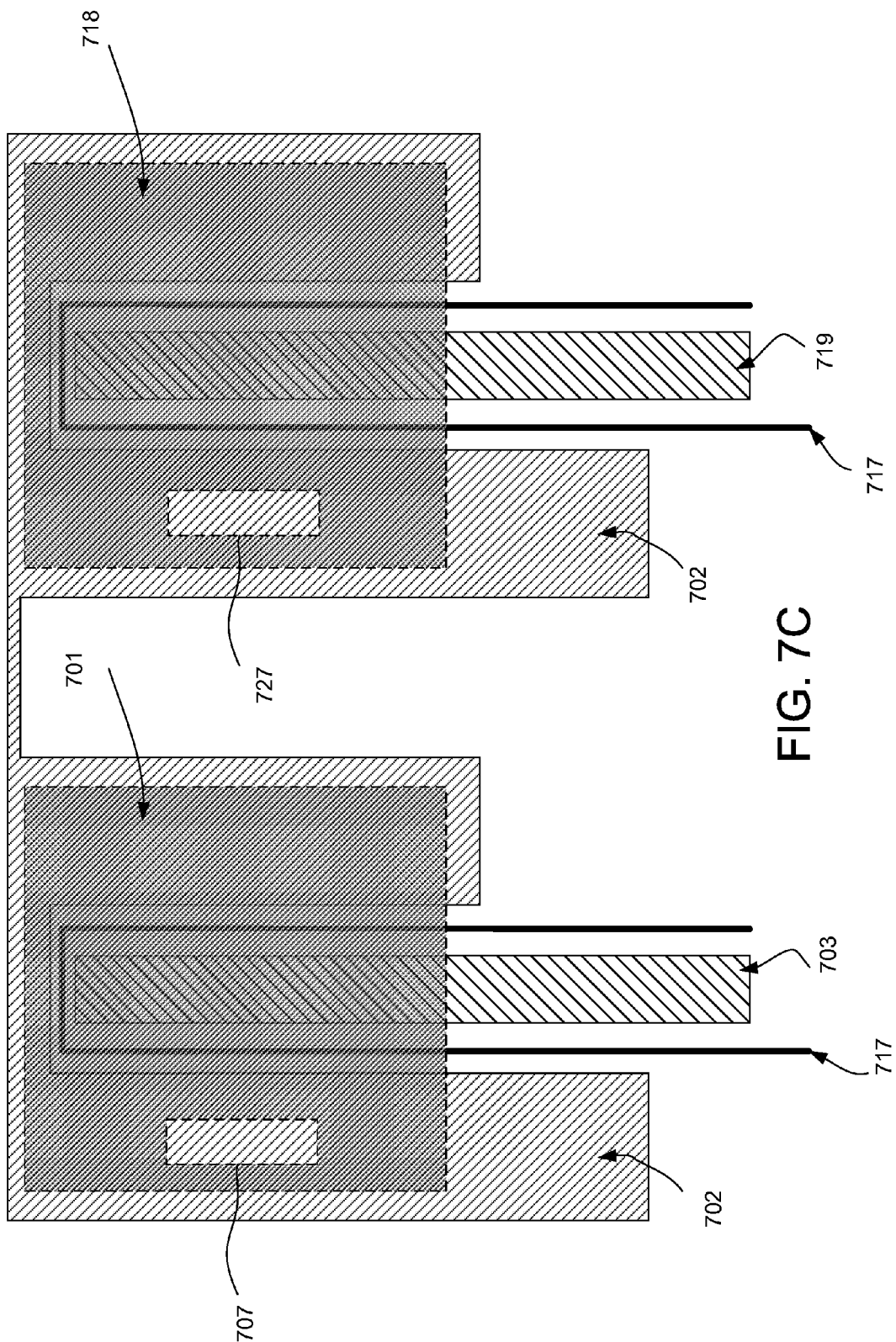

Turning now to FIG. 7C, this figure illustrates two capacitive buttons comprising transmitter sensor electrode 702, receiver sensor electrodes 703 and 719, floating electrodes 701 and 718 and shield electrode 717. The floating electrodes 701 and 718 include apertures 707 and 727 respectively. Transmitter sensor electrode 702 is configured to capacitively couple with both receiver sensor electrodes 703 and 719, floating electrode 701 is disposed over transmitter sensor electrode 702 and receiver sensor electrode 703 and floating electrode 718 is disposed over transmitter sensor electrode 702 and receiver sensor electrode 719. Shield electrode 717 is disposed between transmitter sensor electrode 702 and each receiver sensor electrodes 703 and 719. Shield electrode 717 reduces the direct capacitive coupling between transmitter sensor electrode 702 and each receiver sensor electrode 703 and 719. In embodiments where a shield layer (e.g., ground layer) is present below or near the transmitter sensor electrodes and receiver sensor electrodes, shield electrode 717 may not be disposed between transmitter sensor electrode 702 and receiver sensor electrode 703. The capacitive buttons of FIG. 7C may be disposed in a two-dimensional array, where the two-dimensional array may be a horizontal, vertical, box-like or other orientation. For example, in one embodiment, multiple transmitter sensor electrodes may capacitively couple to one or more receiver sensor electrodes through at least one floating electrode.

Figure 7D:
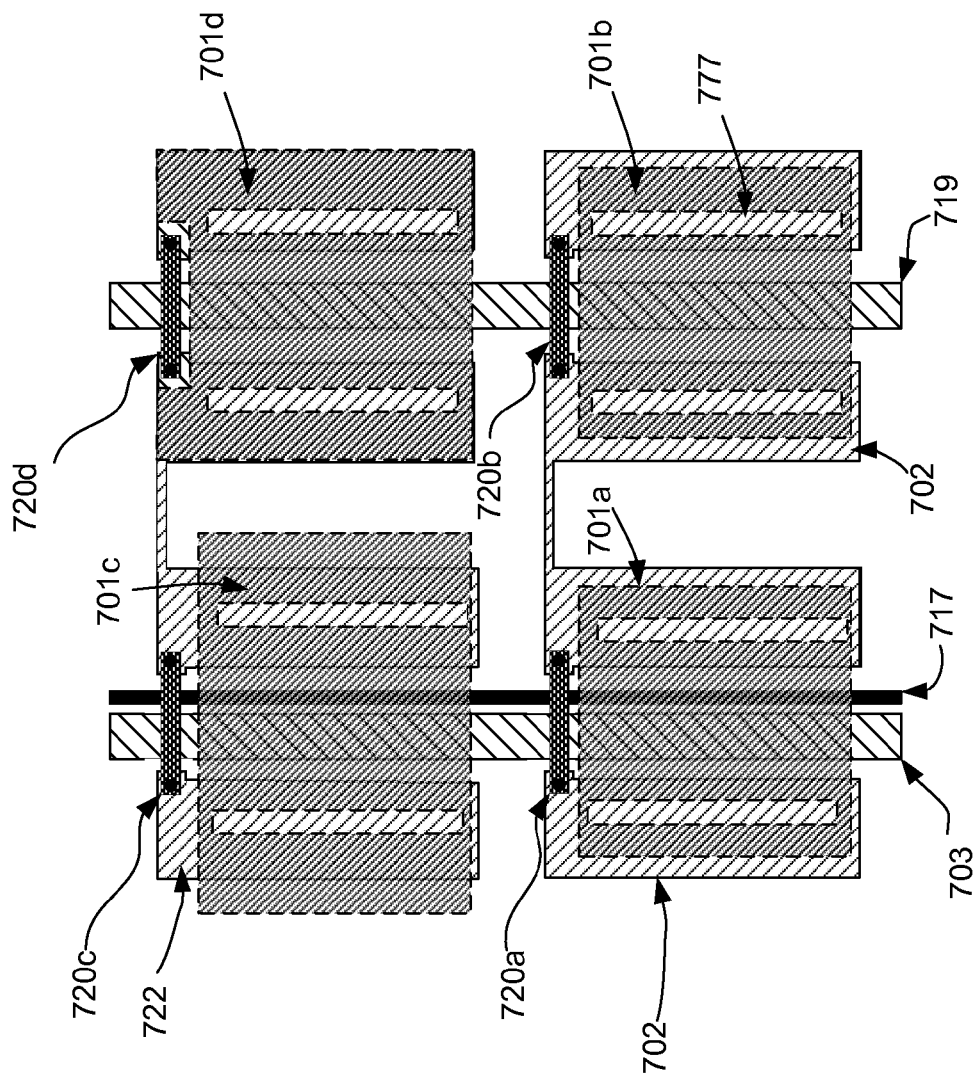

Turning now to FIG. 7D, this figure illustrates a two-dimensional array comprising four capacitive buttons patterned into a box-like orientation to provide a two-by-two button design. As illustrated, each button comprises either transmitter sensor electrode 702 or 722; however, in other embodiments a single transmitter sensor electrodes may be used, and in some embodiments each capacitive button may comprise a different transmitter sensor electrode. FIG. 7D illustrates transmitter sensor electrode 702 comprising jumpers 720a and 720b and transmitter sensor electrode 722 comprises jumpers 720c and 720d. Jumpers 720 (a, b, c, d) may be coupled to their respective transmitter sensor electrodes through vias and may be routed over receiver sensor electrodes 702 and 719. Jumpers 720 (a, b, c, d) and floating electrodes 701 (a, b, c, d) may be disposed on a similar layer. In one embodiment, the jumpers and floating electrodes are disposed in the same layer (e.g., on the same surface of a substrate (not shown)). In various embodiments, the transmitter electrodes and floating electrodes may be disposed on the same layer. In some embodiments an aperture in the floating electrode is positioned in the area around the jumper not on the same layer (or surface of a common substrate) as the jumper. In some embodiments, shield electrode 717 may be disposed adjacent to transmitter and receiver sensor electrodes. In other embodiments, a shield (e.g. ground) layer may be disposed below the transmitter and receiver sensor electrodes or on the same layer as jumpers 720. As illustrated by floating electrodes 701a, 701c, and 701d, floating electrodes may have different sizes. Further, as can be seen in FIG. 7D, each floating electrode 701 comprises apertures 777. FIG. 7D is not meant to be limiting to any one floating electrode and aperture design, but merely is meant to show the different variations that may be used. In various embodiments, receiver sensor electrodes 703 and 719 and transmitter sensor electrodes 702 and 722 are disposed on the same surface of a substrate, opposite surfaces of a single substrate or on surfaces of different substrates. In some embodiments, the floating electrode may be on a first surface of a substrate and at least one of transmitting and receiving sensor electrodes are on a second surface of the substrate. In other embodiments, the floating electrode is on a first substrate and the transmitting and receiving sensor electrodes are not on the first substrate.

Any of the embodiments illustrated in FIG. 7 could be implemented to be mounted over any type of LED or display screen. In such embodiments, transmitting sensor electrode 702, receiving sensor electrode 703 and floating electrode 701 may formed from a suitable transparent material. In one embodiment, the elements may be patterned to indicate to a user the location of the button, activation region and/or the functionality of the button. In some embodiments, input device 700 further comprises a touch surface that may be patterned or transparent. In other embodiments, input device 700 may comprises a layer of material having a patterned design, which may be placed below, over or within input device 700.

Figure 8A:
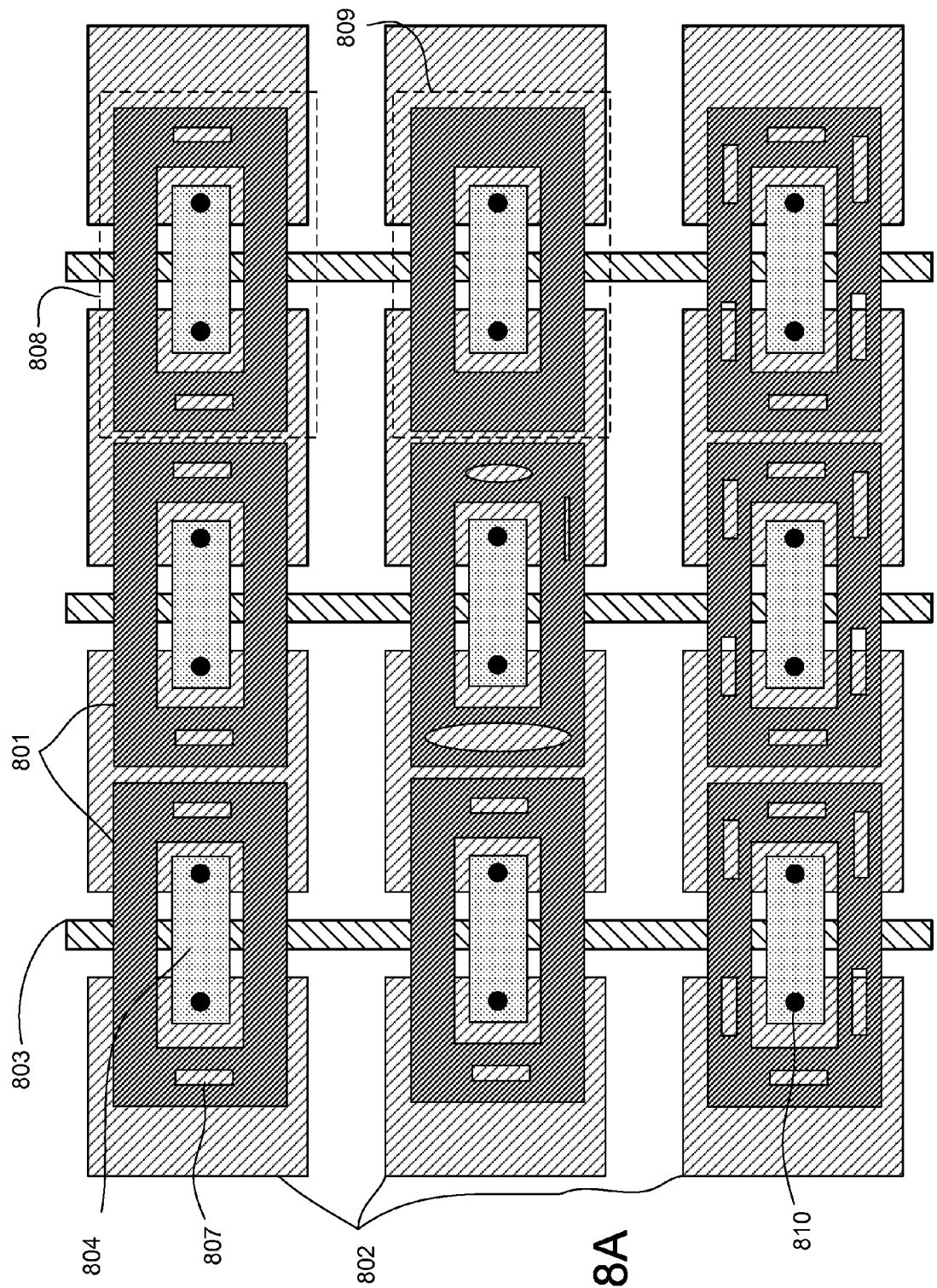

Turning now to FIG. 8A, FIG. 8A illustrates a two-dimensional input device having a set of transmitter sensor electrodes 802 and a set of receiver sensor electrodes 803 disposed on the same face of a substrate layer (not shown). Each transmitter electrode 802 comprises a jumper of the set of jumpers 804. Floating electrodes 801 are provided that each overlaps a portion of two transmitter sensor electrodes 802. And in accordance with the embodiments described herein, each floating electrode 801 includes at least one aperture 807 that at least in part overlaps at least one sensor electrode 802. In the illustrated example, some floating electrodes 801 have different numbers and sizes of apertures, although that would not be typical in an actual implementation. In one embodiment, a shield (e.g., ground) layer 817 may also be disposed on the same layer as floating electrodes 801. In one embodiment, as illustrated by section 809 of FIG. 8A, the floating electrode may comprise only a single aperture, and a jumper is formed within the aperture.

In one embodiment, the sensor electrodes 802 and 803 are each formed on the same layer. Thus, they can be formed with one layer fabrication process, e.g., one deposition and patterning. Likewise, the jumpers 804 and floating electrodes 801 may both formed in the same layer (above the sensor electrodes 802 and 803), again with one layer fabrication process. To facilitate this, the floating electrodes 801 are patterned with an aperture to fit around the jumpers 804. In such an embodiment an insulator layer would typically be provided between the sensor electrodes 802, 803 and the floating electrodes 801 and jumpers 804 to ensure that the floating electrodes 801 remain ohmically isolated from the sensor electrodes. Additionally, the insulator layer would be configured to prevent the jumpers 804 from contacting the receiver sensor electrodes 803 they pass over. In such an embodiment the jumpers 804 would typically be electrically coupled to the sensor electrodes 802 with one or more vias 810 that extend through the insulator layer.

In embodiments where jumpers 804 and floating electrodes 801 are disposed on the same layer, the performance of the input device can be improved without noticeably increasing the complexity or cost of manufacturing the sensor. As described above, each floating electrode 801 with at least one aperture 807 affects the transcapacitive coupling between pairs of transmitter and receiver sensor electrodes. Specifically, the presence of the apertures in floating electrodes overlapping transmitting sensor electrodes increases the reduction in the sensed transcapacitance that occurs in the presence of an object.

Figure 8B:
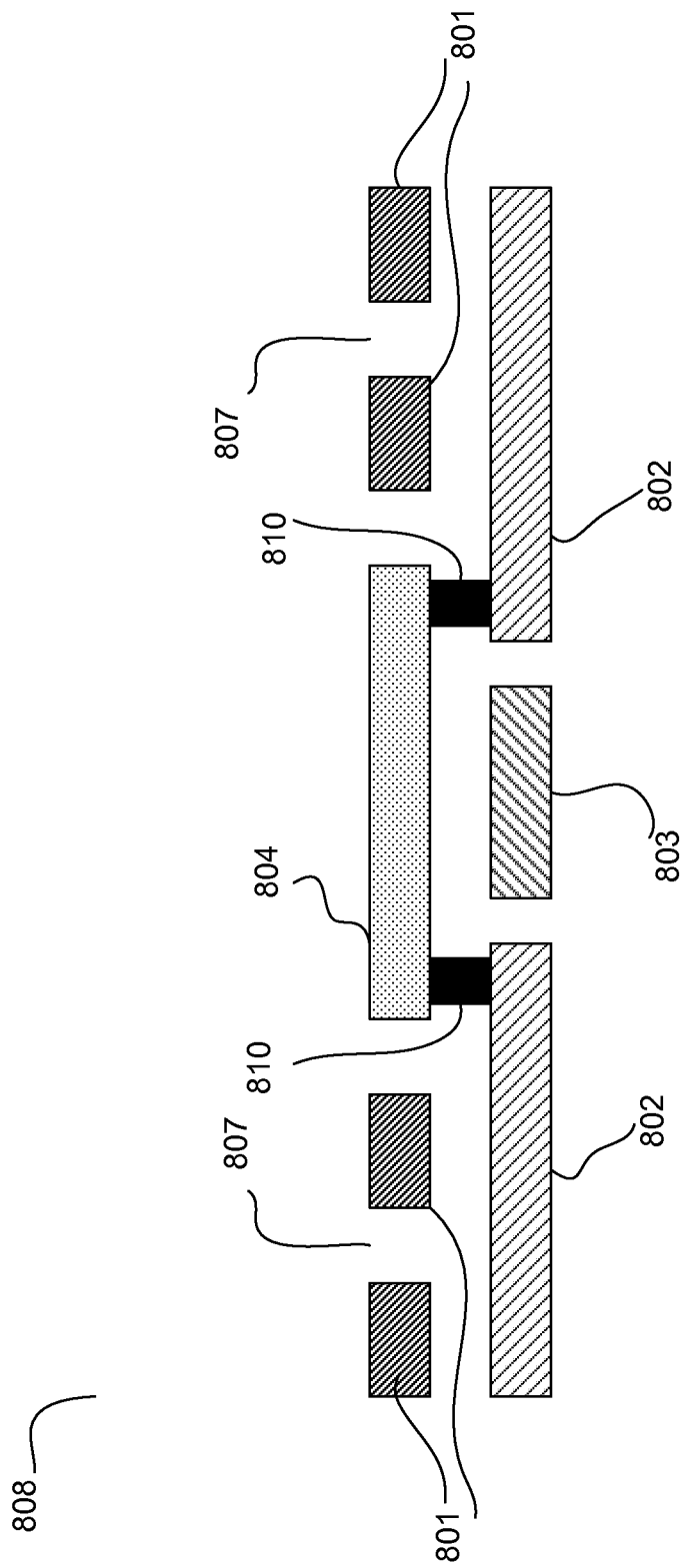

FIG. 8B illustrates a side view of section 808 of FIG. 8A. As illustrated in FIG. 8B, jumper 804 and floating electrode 801 are disposed on a first layer and transmitter electrode 802 and receiver electrode 803 disposed on a second layer, where the first and second layers are different.

Overall, the design in FIG. 8A and FIG. 8B provides an effective input device with all the major conductive elements formed in only two layers. Thus, the design provides the high performance of the floating electrode design with the reduced cost and complexity of a two layer design.

Figure 9A:
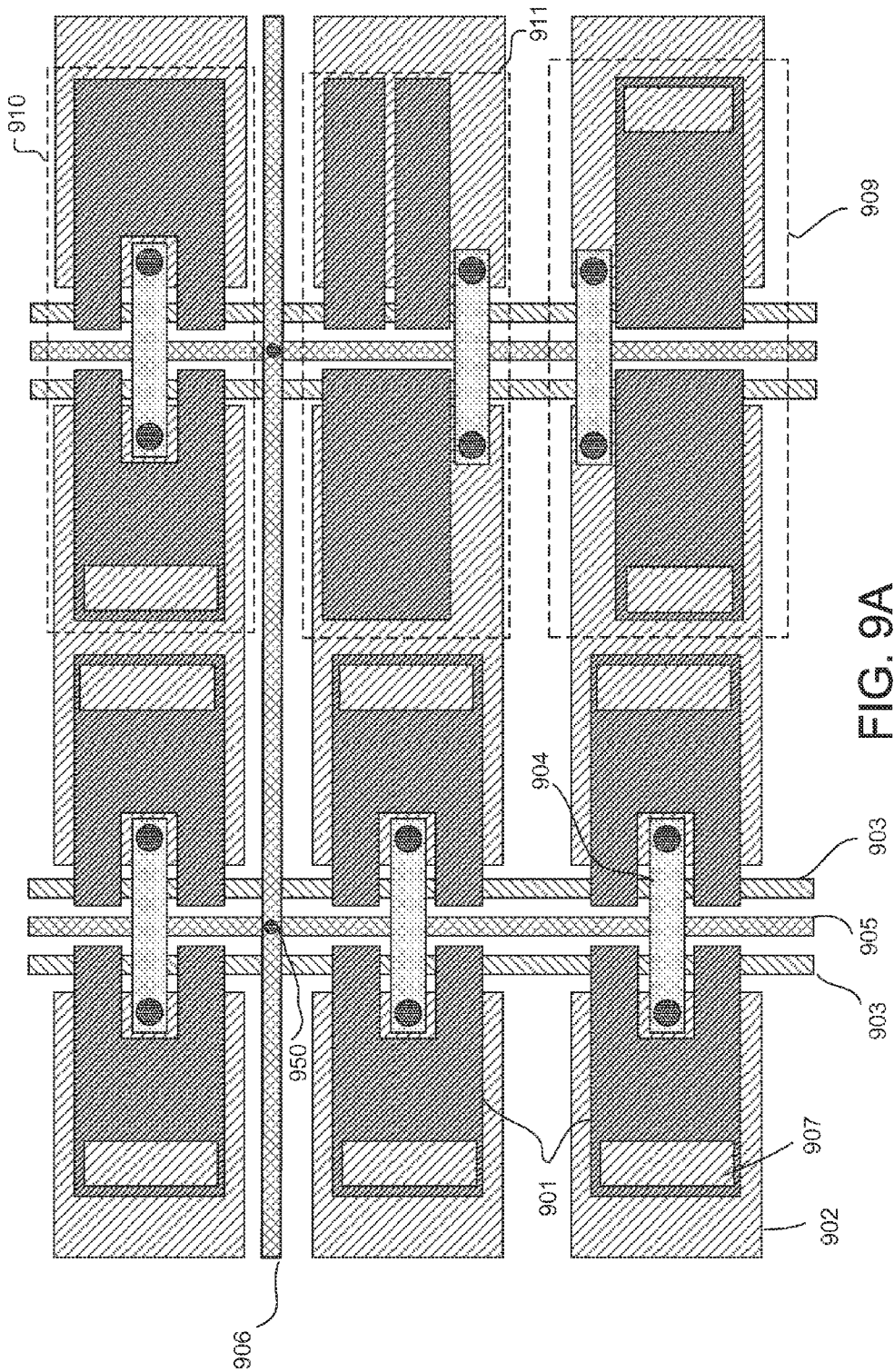

Turning now to FIG. 9A, a variation on the embodiment illustrated in FIG. 8A is illustrated. Specifically, FIG. 9A illustrates an alternate embodiment of a two-dimensional input device. In this alternate embodiment two shield electrodes 905 and 906 are disposed between sensor electrodes. Specifically, transmitter sensor electrodes 902 and receiver sensor electrodes 903 are again disposed in the same layer. A first shield electrode 905 is disposed between receiver sensor electrodes 903 and on the same layer as the sensor electrodes 902 and 903. Furthermore, in this embodiment a second shield electrode 906 is disposed in the same layer as floating electrodes 901, where that layer is again above the sensor electrodes 902 and 903. In various other embodiments shield electrode 906 and/or shield electrode 907 are optional and may not be included. And, as with the other embodiments of FIG. 8A, the floating electrodes 901 each include at least one aperture 907.

By disposing shield electrodes 905 and 906 between sensor electrodes, sensing parameters of the input device can be altered. In one embodiment, by disposing shield electrode 905 between receiver sensor electrodes, each receiver sensor electrodes 903 to be made wider and/or more than one receiver sensor electrode 903 may be disposed beneath each jumper. Specifically, by increasing the width of receiver sensor electrodes 903, the RC time constant of the receiver sensor electrodes 903 is improved and higher sensing frequencies can be used. Also, since the two receiver sensor electrodes 903 are disposed within such a tight proximity, the shield electrode 905 reduces the coupling between those two sensor electrodes 903. In further embodiments, where shield electrodes 905 and 906 are not included, more than one receiver sensor electrode 903 may still be disposed under each jumper.

Furthermore, the configuration of receiver sensor electrodes 903, shield electrodes 905 and floating electrodes 901 decreases the number of jumpers that are required in the sensing area. Specifically, by disposing at least two receiver sensor electrodes 903 in close proximity, more than one receiver sensor electrode may be disposed beneath each jumper reducing the number of jumpers by up to half.

As stated above, the shield electrode 906 may be disposed on the same layer as floating electrodes 901 and between each row of sensor electrodes 902. In this embodiment the shield electrode 906 would typically be coupled to shield electrode 905 through via 950 or other similar structure.

Shield electrodes 905 and shield electrode 906 may be used to further shape the electrical field lines between the transmitter and receiver sensor electrodes. In one embodiment, shield electrode 906 may reduce any cross-coupling between adjacent transmitter electrodes 902. Section 909 of FIG. 9A illustrates a further embodiment where the floating electrodes may be used in conjunction with a jumper, but where the floating electrodes are not shaped to fit around the jumper. In such an embodiment, the floating electrode and jumper may be disposed on a similar layer, reducing the need for any additional layers. Section 910 of FIG. 9A illustrates a variation on this embodiment where the floating electrodes may only have one aperture, such that aperture is shaped around the jumper. Further, section 910 illustrates that in one embodiment, the floating electrodes may have differing number of apertures. Section 911 of FIG. 9A illustrates a variation on this embodiment where the floating electrode comprises two portions, with a space between defining an aperture.

Figure 9B:
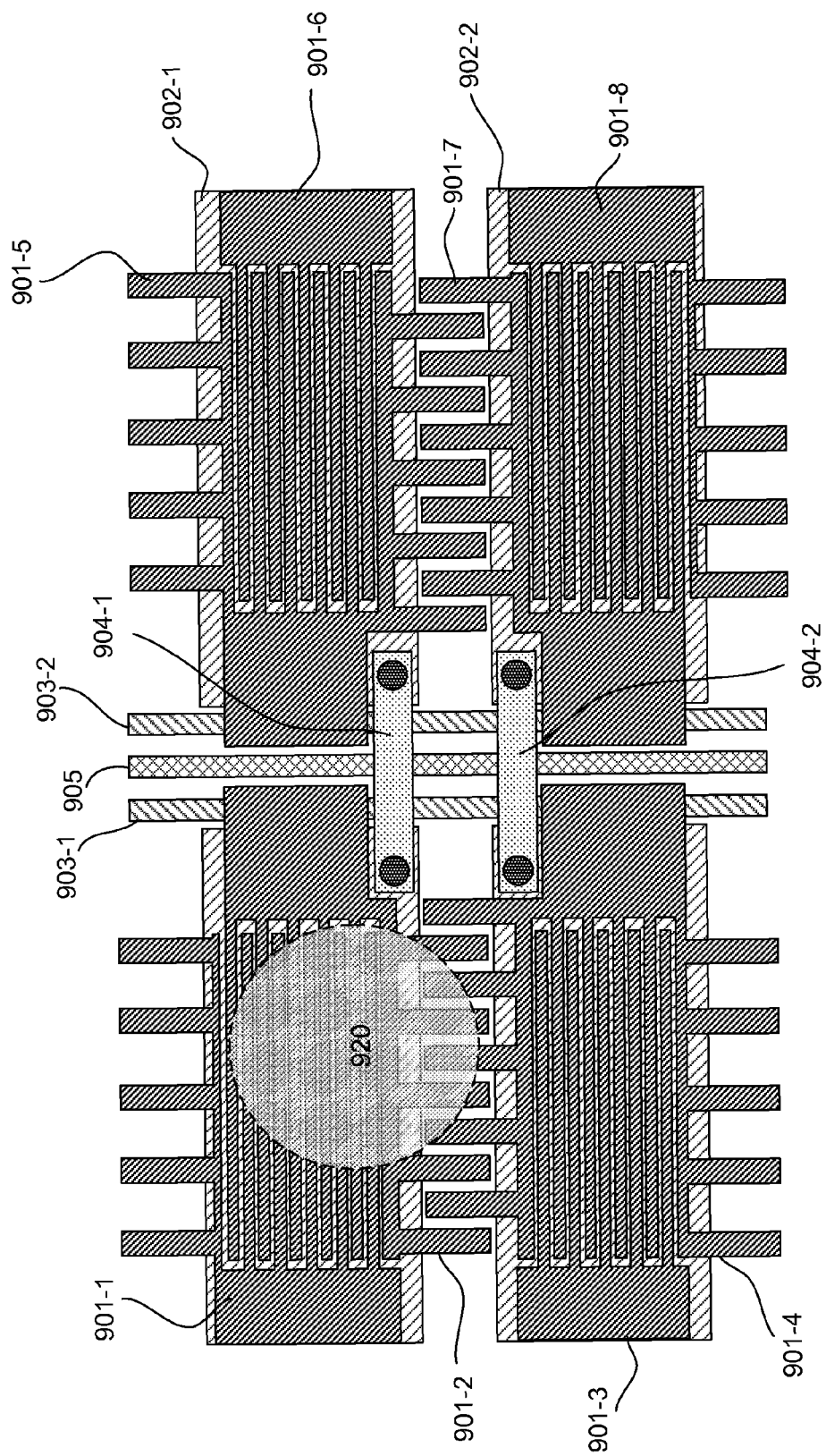

FIG. 9B illustrates a variation on the embodiment illustrated in FIG. 9A. As illustrated in FIG. 9B proximate floating electrodes are interdigitated with one another. In one embodiment, a first floating electrode (e.g., floating electrode 901-1) is interdigitated with a second floating electrode (e.g., floating electrode 901-2). In various embodiments, floating electrodes disposed over a common transmitter electrode (e.g., transmitter electrode 902-1 or transmitter electrode 902-2) may interdigitated with each other. For example, as illustrated in FIG. 9B, floating electrode 901-1 is interdigitated with floating electrode 901-2, floating electrode 901-3 is interdigitated with floating electrode 901-4, floating electrode 901-5 is interdigitated with floating electrode 901-6, and floating electrode 901-7 is interdigitated with floating electrode 901-8. Further, floating electrodes disposed over different transmitter electrodes (e.g., transmitter electrodes 902-1 and 902-2) may be interdigitated with each other. For example, as illustrated in FIG. 9B, floating electrode 901-2 is interdigitated with floating electrode 901-4, and floating electrode 901-5 is interdigitated with floating electrode 901-7. Further, in one embodiment, as illustrated in FIG. 9B, jumpers 904-1 and 904-2 may be disposed such that they are positioned proximate to one another. For example, jumper 904-1 is disposed near a lower edge of transmitter 902-1 and jumper 904-2 is disposed near an upper edge of transmitter 902-2.

Even though the embodiment of FIG. 9B illustrates specific floating electrodes being interdigitated with each other, this meant to be only one non-limiting embodiment. In other embodiments, the floating electrodes may be interdigitated with different floating electrodes, only interdigitated with floating electrodes disposed over a common transmitter electrode or only interdigitated with floating electrodes disposed over different transmitter electrodes. Further, in various embodiments, the floating electrodes may further comprise additional apertures and/or comprise different shapes as discussed above. Further, even though interdigitated floating electrodes are shown to be used with a specific combination of jumpers, 904-1 and 904-2, receiver electrodes, 903-1 and 903-3, and shield electrode 905, interdigitated floating electrodes may be applied to any of the above described embodiments.

In various embodiments, interdigitating the floating electrodes improves the spatial interpolation for an input object (e.g., input object 140) by coupling the input object to more than one floating electrode and affecting the capacitive coupling between more than one transmitter and receiver electrode pair. For example, for an input object at position 920, the input object would couple with floating electrodes 901-1, 901-2, and 901-4. Further, the input object, at position 920, would affect the capacitive coupling between transmitter electrode 902-1 and receiver electrode 903-1 and the capacitive coupling between transmitter electrode 902-2 and receiver electrode 903-1. A measurement of the changes in capacitive couplings may be acquired by processing system 110 and used to provide positional information with improved spatial interpolation.

The various embodiments thus facilitate improved input device performance through the use of at least one aperture in a floating electrode, where the at least one aperture at least in part overlaps the transmitter sensor electrode. The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. An input device for capacitively sensing an input object in a sensing region, comprising:
    a transmitter sensor electrode;
    a receiver sensor electrode; and
    a floating electrode, the floating electrode configured to be electrically floating during operation, wherein a first portion of the floating electrode overlaps a portion of the transmitter sensor electrode and a second portion of the floating electrode overlaps a portion of the receiver sensor electrode, wherein the floating electrode comprises at least one aperture within the first portion of the floating electrode at least in part overlapping the transmitter sensor electrode, and wherein the at least one aperture overlaps the transmitter sensor electrode by a first area, the at least one aperture overlaps the receiver sensor electrode by a second area, and the first area is greater than the second area.

2. The input device of claim 1, wherein the at least one aperture comprises at least one of a hole within the first portion of the floating electrode and a slot within the first portion of the floating electrode.

3. The input device of claim 1, wherein the at least one aperture includes a first aperture and a second aperture within the first portion of the floating electrode, each at least in part overlapping the transmitter sensor electrode.

4. The input device of claim 1, further comprising a filling structure in the at least one aperture.

5. The input device of claim 1 wherein the transmitter sensor electrode and the receiver sensor electrode are disposed on a same layer.

6. The input device of claim 5 further comprising a shield electrode disposed between the transmitter sensor electrode and the receiver sensor electrode.

7. An input device for capacitively sensing an input object in a sensing region, comprising:
    a transmitter sensor electrode;
    a receiver sensor electrode; and
    a floating electrode, the floating electrode configured to be electrically floating during operation, wherein a first portion of the floating electrode overlaps a portion of the transmitter sensor electrode and a second portion of the floating electrode overlaps a portion of the receiver sensor electrode, and wherein the floating electrode comprises a first aperture within the first portion of the floating electrode and at least in part overlapping the transmitter sensor electrode;
where the transmitter sensor electrode comprises a jumper, wherein the jumper and the floating electrode are disposed on a same layer, and wherein the jumper crosses over the receiver sensor electrode and is electrically insulated from the receiver sensor electrode.

8. An input device for capacitively sensing input objects in a sensing region, comprising:
a set of transmitter sensor electrodes;
a set of receiver sensor electrodes; and
a set of floating electrodes, each floating electrode of the set of floating electrodes configured to be electrically floating in operation, wherein a first portion of a first floating electrode of the set of floating electrodes overlaps a first portion of a first transmitter sensor electrode of the set of transmitter sensor electrode and a second portion of the first floating electrode of the set of floating electrodes overlaps a first portion of a first receiver sensor electrode of the set of receiver sensor electrodes, the first floating electrode of the set of floating electrodes comprising at least one aperture within the first portion of the first floating electrode and at least in part overlapping the first transmitter sensor electrode, wherein the at least one aperture overlaps the first transmitter sensor electrode by a first area, the at least one aperture overlaps a first receiver sensor electrode by a second area, and the first area is greater than the second area.

9. The input device of claim 8 wherein each transmitter sensor electrode in the set of transmitter sensor electrodes is capacitively coupled to at least one receiver sensor electrode in the set of receiver sensor electrodes to form a set of transcapacitances.

10. The input device of claim 8 further comprising a processing system coupled to the set of transmitter sensor electrodes and the set of receiver sensor electrodes, the processing system configured to:
transmit with the first transmitter sensor electrode of the set of transmitter sensor electrodes;
receive a resulting signal with the first receiver sensor electrode of the set of receiver sensor electrodes while transmitting with the first transmitter sensor electrode; and
determine positional information for an input object in the sensing region based at least in part on a first measurement of the resulting signal.

11. The input device of claim 8, wherein a first portion of a second floating electrode of the set of floating electrodes overlaps a first portion of a second transmitter sensor electrode of the set of transmitter sensor electrode and a second portion of the second floating electrode of the set of floating electrodes overlaps a first portion of a second receiver sensor electrode of the set of receiver sensor electrodes, the second floating electrode of the set of floating electrodes comprising at least one aperture within the first portion of the second floating electrode of the set of floating electrodes and at least in part overlapping the second transmitter sensor electrode.

12. The input device of claim 8, wherein the set of transmitter sensor electrodes and the set of receiver sensor electrodes are disposed on a same layer.

13. The input device of claim 8, wherein the first floating electrode is interdigitated with a second floating electrode of the set of floating electrodes.

14. An input device for capacitively sensing input objects in a sensing region, comprising:
a set of transmitter sensor electrodes;
a set of receiver sensor electrodes; and
a set of floating electrodes, each floating electrode of the set of floating electrodes configured to be electrically floating in operation, wherein a first portion of a first floating electrode of the set of floating electrodes overlaps a first portion of a first transmitter sensor electrode of the set of transmitter sensor electrode and a second portion of the first floating electrode of the set of floating electrodes overlaps a first portion of a first receiver sensor electrode of the set of receiver sensor electrodes, the first floating electrode of the set of floating electrodes comprising at least one aperture within the first portion of the first floating electrode and at least in part overlapping the first transmitter sensor electrode;
wherein the first transmitter sensor electrode of the set of transmitter sensor electrodes comprises at least one jumper, wherein the at least one jumper and the set of floating electrodes are disposed on the same layer and wherein the at least one jumper crosses over at least one of the set of receiver sensor electrodes.

15. The input device of claim 14 wherein the at least one jumper is encompassed by the first floating electrode.

16. The input device of claim 14 wherein the at least one jumper crosses over two receiver sensor electrodes of the set of receiver sensor electrodes.

17. A method for forming an input device for capacitively sensing an input object in a sensing region, comprising:
forming a transmitter sensor electrode;
forming a receiver sensor electrode; and
forming a floating electrode, the floating electrode configured to be electrically floating during operation, wherein a first portion of the floating electrode overlaps a portion of the transmitter sensor electrode and a second portion of the floating electrode overlaps at least a portion of the receiver sensor electrode, and wherein the floating electrode comprises at least one aperture within the first portion of the floating electrode and at least in part overlapping the transmitter sensor electrode, wherein the at least one aperture overlaps the transmitter sensor electrode by a first area, the at least one aperture overlaps the receiver sensor electrode by a second area, and the first area is greater than the second area.

18. The method of claim 17, wherein the at least one aperture comprises at least one of a hole within the floating electrode and a slot within the floating electrode.

19. The method of claim 17, wherein the floating electrode further comprises a first aperture and a second aperture within the first portion of the floating electrode and at least in part overlapping the transmitter sensor electrode.

20. The method of claim 17 further comprising forming a jumper coupled to the transmitter sensor electrode, wherein the jumper and floating electrode are formed on a same layer, and wherein the jumper crosses over the receiver sensor electrode and is electrically insulated from the receiver sensor electrode.

* * * * *